(12) United States Patent
Ismail et al.

(10) Patent No.: US 12,375,043 B2
(45) Date of Patent: Jul. 29, 2025

(54) AGING-AVERSE BANDWIDTH EXTENSION APPARATUS

(71) Applicant: Avago Technologies International Sales Pte. Limited, Singapore (SG)

(72) Inventors: Yousr Ismail, Irvine, CA (US); Adesh Garg, Aliso Viejo, CA (US)

(73) Assignee: Avago Technologies International Sales Pte. Limited, Palo Alto, CA (US)

( * ) Notice: Subject to any disclaimer, the term of this patent is extended or adjusted under 35 U.S.C. 154(b) by 431 days.

(21) Appl. No.: 17/877,157

(22) Filed: Jul. 29, 2022

(65) Prior Publication Data
US 2024/0039483 A1    Feb. 1, 2024

(51) Int. Cl.
*H03F 1/48*    (2006.01)
*H03F 1/42*    (2006.01)

(52) U.S. Cl.
CPC .................. *H03F 1/483* (2013.01)

(58) Field of Classification Search
CPC ............... H03F 1/483; H03F 2200/156; H03F 2200/36; H03F 3/3022; H03F 1/42; H03K 19/00315; H03M 9/00
USPC ......................................................... 330/277
See application file for complete search history.

(56) References Cited

U.S. PATENT DOCUMENTS

| | | | |
|---|---|---|---|
| 7,009,425 B1 | 3/2006 | Loinaz et al. | |
| 7,215,194 B2 | 5/2007 | Kucharski et al. | |
| 7,288,971 B1 | 10/2007 | Plasterer et al. | |
| 9,735,989 B1 | 8/2017 | Xie et al. | |
| 9,755,599 B2 | 9/2017 | Yuan et al. | |
| 9,774,315 B2 | 9/2017 | Namkoong et al. | |
| 10,291,192 B1 | 5/2019 | Casey et al. | |
| 11,398,934 B1 * | 7/2022 | Casey | .................. H04L 25/0272 |

FOREIGN PATENT DOCUMENTS

DE        602016043298        9/2020

* cited by examiner

*Primary Examiner* — Hieu P Nguyen
(74) *Attorney, Agent, or Firm* — Quarles & Brady LLP

(57) ABSTRACT

A circuit for inductive peaking may include a driver, an inverter, a resistor between an output node of the driver and an input node of the inverter and a switch. For example, a first node of the resistor may be connected to the output node of the driver and a second node of the resistor may be connected to the input node of the inverter. The switch may be connected between an output node of the inverter and the first node of the resistor. An input node of the driver may correspond to an input node of the circuit and the output node of the driver may correspond to an output node of the circuit.

17 Claims, 16 Drawing Sheets

AGING-AVERSE BANDWIDTH EXTENSION APPARATUS

TECHNICAL FIELD

The present disclosure is directed to an apparatus for performing bandwidth extension and, more particularly, to an apparatus providing bandwidth extension in a manner that mitigates aging issues.

BACKGROUND

To meet stringent data-rate requirements of high-end serializer/deserializer (SERDES) products, advanced complementary metal-oxide-semiconductor (CMOS) technology processes and on-chip bandwidth extension techniques are commonly considered to achieve reasonable intersymbol interference (ISI) and reliable bit error rates (BER).

Inductive peaking is one approach that may be employed to boost high-frequency gain to compensate for bandwidth limitations (i.e., a limit within a band of wavelengths, frequencies, or energies). In particular, an active inductor implementation using only transistors may be desirable since an active inductor may occupy a relatively smaller area than a passive inductor and may further be compatible with switching CMOS circuits.

However, active inductors typically suffer from destructive aging effects that may result in degraded performance over time and ultimately limit an operational lifetime. The aging problems are often exacerbated by adverse operating conditions for high-speed SERDES circuits such as high-temperature operation and power supplied by voltages that are higher than typical foundry recommendations.

There is therefore a need to develop systems and methods to cure the above deficiencies.

SUMMARY

A circuit is disclosed in accordance with one or more illustrative embodiments of the present disclosure. In one illustrative embodiment, the circuit includes a driver and an inverter. In another illustrative embodiment, the circuit includes a resistor between an output node of the driver and an input node of the inverter, where a first node of the resistor is connected to the output node of the driver and a second node of the resistor is connected to the input node of the inverter. In another illustrative embodiment, the circuit includes a switch between an output node of the inverter and the first node of the resistor, where an input node of the driver corresponds to an input node of the circuit, and where the output node of the driver corresponds to an output node of the circuit.

A system is disclosed in accordance with one or more illustrative embodiments of the present disclosure. In one illustrative embodiment, the system includes one or more circuits, each comprising a driver, an inverter, a resistor connected between an output node of the driver and an input node of the inverter, and a switch between an output node of the inverter and the first node of the resistor. The first node of the resistor may be connected to the output node of the driver and a second node of the resistor may be connected to the input node of the inverter. An input node of the driver may correspond to an input node of the circuit and the output node of the driver may correspond to an output node of the circuit. In another illustrative embodiment, the system includes a controller coupled to the one or more circuits, where the controller independently directs the switch in each of the one or more circuits to operate in one of an open state or a closed state.

A method is disclosed in accordance with one or more illustrative embodiments of the present disclosure. In one illustrative embodiment, the method includes generating a design of a circuit including a driver with a first bandwidth, an inverter, and a resistor connected between an output node of the driver and an input node of the inverter. In another illustrative embodiment, the resistor is formed from two or more transistors. A first node of the resistor may be connected to the output node of the driver and a second node of the resistor may be connected to the input node of the inverter. In another illustrative embodiment, an output node of the inverter is connected to the output node of the driver. An input node of the driver may correspond to an input node of the circuit, wherein the output node of the driver corresponds to an output node of the circuit. In another illustrative embodiment, the method includes selecting, in the design of the circuit, at least one of a value of the resistor, a size of the driver, or a size of the inverter such that the circuit has a second bandwidth larger than the first bandwidth. In another illustrative embodiment, the method includes converting, in the design of the circuit, at least one of the two or more transistors in the resistor to a switch, where a first node of the switch is connected to the output node of the inverter, where a second node of the switch is connected to the output node of the driver, and where the circuit has a third bandwidth smaller than the second bandwidth. In another illustrative embodiment, the method includes adding one or more additional transistors to the resistor in the design of the circuit. In another illustrative embodiment, the method includes increasing a size of the switch in the design of the circuit to provide that the circuit has the second bandwidth.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
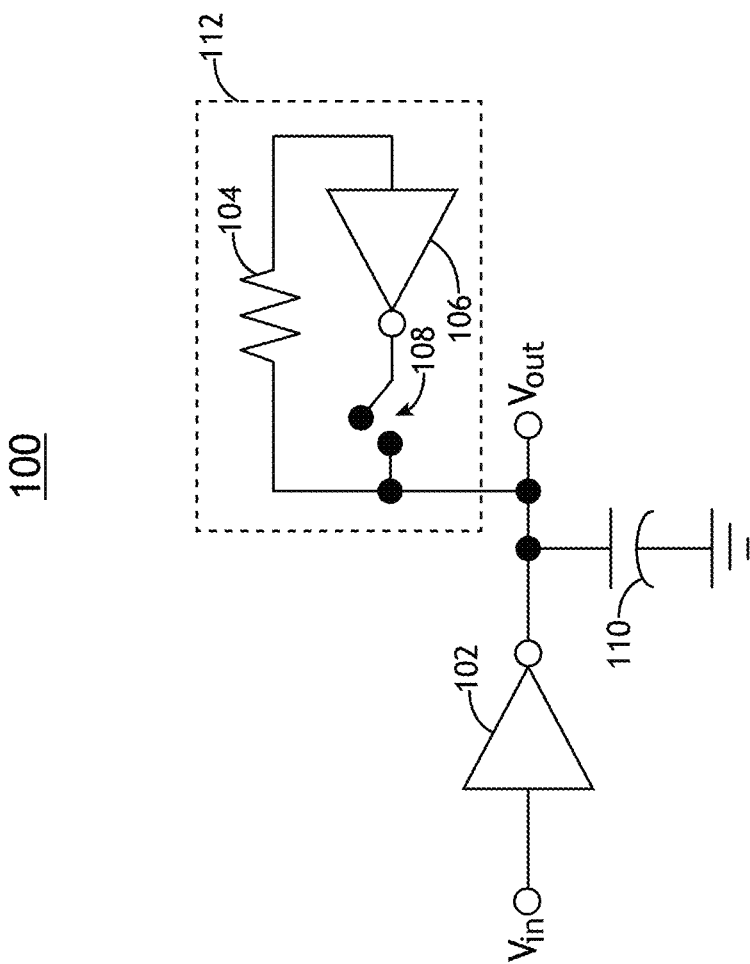
FIG. 1A is a schematic view of a bandwidth extension circuit, in accordance with one or more embodiments of the present disclosure.

Reference will now be made in detail to the subject matter disclosed, which is illustrated in the accompanying drawings. The present disclosure has been shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

As used herein, directional terms such as "top," "bottom," "over," "under," "upper," "upward," "lower," "down," and "downward" are intended to provide relative positions for purposes of description and are not intended to designate an absolute frame of reference. Various modifications to the described embodiments will be apparent to those with skill in the art, and the general principles defined herein may be applied to other embodiments.

It is to be understood that depicted architectures are merely exemplary and that many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Additionally, it is envisioned, a coupling may include intervening elements or members between coupled members which are electrically or communicatively coupled.

Unless otherwise indicated, a description indicating that one component is "connected to" another component (alternatively "located on," "disposed on," or the like) or "between" two components indicates that such components are functionally connected and does not necessarily indicate that such components are physically in contact. Rather, such components may be in physical contact or may alternatively include intervening elements. The term node (or alternatively, terminal) is used herein to indicate a point of connection between circuit elements or portions thereof. In this way, Components connected to a node may be physically connected in any suitable manner. In some embodiments, components connected to a node share a common electrical contact and may thus be, but are not required to be, physically proximate. In some embodiments, components connected to a node are connected through one or more electrically-conductive pathways such as, but not limited to, traces or wires. Further, components may be described as having one or more nodes (e.g., an input node, an output node, or the like) to indicate points for connection to other components. It is contemplated herein that descriptions of the connections between circuit components using nodes is solely for illustrative purposes and does not imply any particular technique for connecting such components.

Embodiments of the present disclosure are directed to systems and methods for providing bandwidth extension of a driver in a manner that mitigates adverse effects of aging to promote relatively long operational lifetimes. A driver may include any type of device that repeats and/or amplifies a signal (e.g., a logic signal) such as, but not limited to, an inverter (e.g., a device that converts a logical high to a logical low or vice versa) or a buffer (e.g., a device that provides a logical high output in response to a logical high input and provides a logical low output in response to a logical low input). Some embodiments of the present disclosure are directed to bandwidth extension utilizing an active inductor providing inductive peaking. For example, a driver (e.g., an inductor, a buffer, or the like) may provide a baseline bandwidth (e.g., a first bandwidth). However, this first bandwidth may be extended (e.g., to a second bandwidth) by an inverter or a bandwidth extension circuit more generally. For example, a bandwidth extension circuit may include a driver, where an output node of a driver is connected to the input node of an inverter through a resistor, and where the active inductor further includes a switch between an output node of the inverter and the output node of the driver. A resistor may be any component that limits or regulates the flow of electric current in a circuit. Such a circuit may be operated either with the switch in a closed position to provide inductive peaking based on feedback from the inverter or with the switch in an open position without feedback.

A bandwidth extension circuit and associated components (e.g., constituent inverters, or the like) may operate as logic devices designed to input and output a high bit (e.g., a logical "1") or a low bit (e.g., a logical "0"). The actual voltage values associated with a high bit (e.g., a high voltage value) or a low bit (e.g., a low voltage value) may depend on the fabrication process and/or the specific design. In some embodiments, a high voltage value associated with a high bit corresponds to an ideal value of 1 V, while a low voltage value associated with a low bit corresponds to an ideal value of 0V. Such a configuration may be suitable for a variety of fabrication processes including, but not limited to, complementary metal-oxide-semiconductor (CMOS) processes or transistor-transistor logic (TTL) processors. However, other embodiments may allow different high voltage values for high bits such as, but not limited to, 5V, 10 V, or 18 V. Further, it is to be understood that logic devices may generally operate with input and output voltages within operational ranges for both high bits and low bits. For the purposes of the present disclosure, the terms high voltage, high voltage value, and high bit are used interchangeably to refer to a logical high state and may include an associated operational voltage range. Similarly, the terms low voltage, low voltage value, and low bit are used interchangeably to refer to a logical low state and may include an associated operational voltage range.

An inverter (e.g., a driver and/or the inverter coupled with a driver for bandwidth extension) may include any device that provides a logical inverse operation. For example, an inverter may output a low bit upon receiving a high bit and may output a high bit upon receiving a low bit. Further, such an inverter may be fabricated using any suitable processes or technology. In this way, an inverter of a bandwidth extension circuit as disclosed herein may include, but is not limited to, one or more field-effect transistors (FETs), one or more finFETs, one or more MOSFETs, one or more bipolar junction transistors (BJTs), one or more junction field-effect transistors (JFETs), one or more insulated-gated bipolar transistors (IGBTs), one or more high-electron-mobility transistors (HEMTs), one or more tunnel field-effect transistors (TFETs), one or more carbon nanotube FETs (CNT-FETs), or one or more junction-less nanowire transistors (JLNTs). As a non-limiting illustration, an inverter fabricated according to CMOS processes (e.g., a CMOS inverter) may include two complementary transistors (e.g., a PMOS transistor and an NMOS transistor) with a common gate electrode, where a drain of the PMOS transistor is connected to a drain of the NMOS transistor. A transistor may be any device that regulates, controls, amplifies, or switches an electrical signal.

An active inductor may include one or more transistors and potentially other components arranged to provide an inductance. An active inductor may be contrasted with a passive inductor, which is typically formed from a wire wrapped around a coil to store energy in a magnetic field. Active inductors may typically be fabricated with a smaller size than passive inductors, may provide additional flexibility and/or tunability relative to a passive inductor, and may be compatible with common fabrication processes such as, but not limited to, CMOS fabrication processes. As used herein, a size of a component may refer to the physical size of the component (e.g., width). In this way, an active inductor may be fabricated as an on-chip device in tight form factors using CMOS-compatible manufacturing techniques.

Additionally, a switch as used herein may include one or more transistors arranged to operate in a closed state or an open state with respect to an input node and an output node, where an operational state of the switch may be controlled by a drive signal. For example, a switch operating in an open state (e.g., a non-conducting state) may restrict or eliminate current flow between the input node and the output node, whereas a switch operating in a closed state (e.g., a conducting state) may allow current flow between the input node and the output node.

It is recognized herein that operating a transistor under certain conditions (referred to herein as aging conditions) may induce structural changes that may degrade performance but not result in abrupt device breakdown, a phenomenon referred to herein as aging. A transistor may be operated under such aging conditions for extended periods of time without catastrophic breakdown. However, extended operation under aging conditions may typically result in a reduced operational lifetime of that transistor compared to operation under less damaging conditions.

As an illustration, two significant sources of aging transistors include hot carrier injection (HCl) and bias temperature instability (BTI). HCl may typically occur when a transistor simultaneously experiences high drain-source ($V_{ds}$) and gate-source ($V_{gs}$) voltages, which may be associated with large current flow. When such conditions are present, charges may become trapped in a gate of the transistor resulting in reduced carrier mobility and reduced current capacity. In many cases, the effects of HCl aging are not reversable. BTI may be typically induced under conditions of high gate voltage and/or high temperature and results in trapped charges and reduced operational voltage thresholds. In many cases, long-term effects of BTI may be partially reversed by periodically inverting the gate voltage polarity. For this reason, one approach to mitigating BTI is to modulate the gate voltage (e.g., alternate between high bits and low bits) when possible. It is to be understood that the description of aging conditions in MOS devices is provided solely for illustrative purposes and are not limiting on the circuits, systems and method disclosed herein. It is contemplated that a bandwidth extension circuit as disclosed herein may be operational in a manner that mitigates aging regardless of the selected fabrication process. In this way, the circuits, systems and methods disclosed herein are not limited to devices using CMOS inverters, but may extend to alternative technologies including, but not limited to, FET inverters more generally, BJT inverters, or other inverter types including a switch.

Many active inductor designs include transistors that are exposed to aging conditions for extended times under normal operation and thus typically suffer from relatively low operational lifetimes. Further, typical approaches for mitigating aging in active inductors prioritize mitigation of one source of aging (e.g., HCl or BTI) over another depending on a mode of operation of the circuit.

However, a bandwidth extension circuit including an active inductor as disclosed herein may substantially limit exposure of constituent transistors to aging conditions and may thus have substantially longer lifetimes than alternative designs. In this way, such a circuit (or components thereof including the active inductor) may be aging averse.

A bandwidth extension circuit as disclosed herein may be operable in different modes depending on a state of the switch to provide aging-averse operation.

For example, operation of the bandwidth extension circuit with the switch in a closed mode is referred to herein as an active mode. In this active mode, the closed switch may connect the output nodes of the two inverters, which also induces feedback across the inverter such that the device operates as an active inductor. Further, the circuit in the active mode may provide inductive peaking and may thus be used to compensate for bandwidth limitations of a communications system such as, but not limited to, a serializer/deserializer (SERDES) system.

It is contemplated herein that signals provided to the bandwidth extension circuit during the active mode (e.g., signals including data to be transmitted) typically include many transitions between high and low voltages (e.g., the signal includes transitions between high and low bits) such that BTI effects are negligible or at least within acceptable tolerances.

However, operation in the active mode may expose at least some transistors within the inverters to conditions that produce HCl. For example, operation with a high input voltage (e.g., a high bit in an input signal) may result in relatively large drain-source ($V_{ds}$) and/or gate-source ($V_{gs}$) voltages and associated relatively high current flow due to feedback from the inverter. Since this feedback condition is necessary for the operation of the device to provide inductive peaking, HCl under these conditions may be unavoidable to some extent. However, it is further contemplated herein that the presence of the switch may reduce the required drain-source ($V_{ds}$) across the transistors constituting the inverter relative to a design without the switch such that aging may be substantially reduced relative to a design without the switch.

As another example, operation of the bandwidth extension circuit with the switch in an open mode is referred to herein as a power-down mode.

It is contemplated herein that typical bandwidth extension circuit designs operate under particularly damaging aging conditions when an input signal is constant (e.g., either as a high bit or a low bit) for an extended time. In the context of a communications system, this may occur when no information is being communicated. Under these conditions, conditions for both HCl and BTI may be present. Modulation of the input signal in these conditions (e.g., providing an arbitrary input signal with randomized data) may mitigate BTI but not HCl. This may be particularly the case when the frequency of the alternating input data pattern is slow (e.g., when data is not actively being provided to the circuit). To avoid HCl in this mode of operation, the driver gate voltage and the inverter gate voltage can be tied to opposite polarities through additional power-down switches while disconnecting the feedback resistor. However, in this case, the input data cannot be continuously toggled to mitigate BTI aging as may be the case when no additional power down switches are used. That is to say, there exists some conflict between the mitigation of BTI and HCl simultaneously for an active peaked circuit.

However, operation of a bandwidth extension circuit as disclosed herein in the power-down mode may mitigate both BTI and HCl. In this power-down mode, the output nodes of the two inverters are decoupled such that the two inverters are simply in series with the resistor between them, which eliminates fighting amongst them to pull the output node in opposite directions as may be the case if no switch is used. As a result, the feedback conditions that contribute to HCl are removed. Further, modulation of the input signal in this power-down mode may also mitigate BTI as there is no need to inversely correlate the gate voltages of the driver and the inverter continuously as would be the case if no such decoupling between the driver and inverter is implemented.

Additional embodiments of the present disclosure are directed to a communications system including at least one bandwidth extension circuit with a switch as disclosed herein, as well as a controller for controlling the operational mode of the switch. In this way, the controller may selectively operate one or more bandwidth extension circuits in the active mode or the power-down mode. The communications system may further include a source to provide or otherwise control an input signal to one or more bandwidth extension circuits. In some embodiments, the controller is further coupled to the source and may direct the source to provide a modulated input signal (e.g., including randomized data, alternating high and low voltages, or the like) to one or more bandwidth extension circuits when in a power-down mode to mitigate aging of the active inductor during the power-down mode.

Additional embodiments of the present disclosure are directed to methods for designing a bandwidth extension circuit as disclosed herein. For example, the method may include, but is not limited to, selecting initial values and/or sizes of various components of a bandwidth extension circuit with an active inductor to provide a desired amount of inductive peaking, adding a switch to selectively provide feedback based on the active inductor, determining a reduction of the inductive peaking performance due to the switch, and adjusting the values of at least some of the values and/or sizes of the components to at least partially compensate for the reduction of the performance due to the switch.

As is known, one or more transistors (e.g., FET transistors) may be fabricated with varied designs of the physical layout between a gate structure and doped material forming drain and source regions. In particular, a gate structure (e.g., a gate electrode) may be fabricated as a single strip (e.g., a 1-finger design) or as multiple connected strips (e.g., a multi-finger design) over doped regions, where the term finger (e.g., a transistor pair) denotes a number of such strips. For example, a 1-finger design may include a gate structure with a single strip, a 2-finger design may include a gate structure with two strips, and so on. Multi-finger designs may be utilized for various reasons including, but not limited to, controlling a physical layout size or a gate resistance. Further, multi-finger layouts may be used to fabricate multiple connected devices as will be described in greater detail below.

Referring now to FIGS. 1A-10, circuits, systems and methods for bandwidth extension (e.g., using inductive peaking, or the like) with an active inductor are described in greater detail, in accordance with one or more embodiments of the present disclosure.

FIG. 1A is a schematic view of a bandwidth extension circuit 100, in accordance with one or more embodiments of the present disclosure. In some embodiments, the bandwidth extension circuit 100 includes a first driver (referred to herein as a driver 102) in series with a resistor 104 and an inverter 106. The driver 102 may include any type of driver circuit known in the art such as, but not limited to, a buffer or an inverter (e.g., as illustrated in FIG. 1A). Further, the inverter 106 may be, but is not limited to, an inverter. For example, the resistor 104 may be connected between an output node of the driver 102 and an input node of the inverter 106. The bandwidth extension circuit 100 may further include a switch 106 between an output node of the inverter 106 and the output node of the driver 102. In this configuration, an input node of the bandwidth extension circuit 100 ($V_{in}$) may correspond to the input node of the driver 102 and an output node of the bandwidth extension circuit 100 ($V_{out}$) may correspond to the output node of the driver 102. FIG. 1A further depicts a load capacitance 108, which may be associated with various internal capacitances of the components of the bandwidth extension circuit 100

(e.g., the driver 102, the inverter 106, and/or any additional components) and/or an additional capacitor.

In a general sense, the bandwidth extension circuit 100 may be characterized as a drive circuit and may be suitable as a repeater to strengthen a transmitted signal, which may be suitable for, but is not limited to, extending a transmission range of the signal.

The bandwidth extension circuit 100 may be operable in different modes depending on a state of the switch 106 (e.g., whether the switch 106 is in a closed state or an open state).

Operation of the switch 106 in a closed state may enable feedback across the inverter 106. In this mode, referred to herein as an active mode, the resistor 104 and the inverter 106 may operate as an active inductor 110 load to the driver 102. Such a bandwidth extension circuit 100 may be characterized as a shunt-peaked driver using the active inductor 110. This active inductor 110 may be suitable for providing inductive peaking to boost a high-frequency gain of the bandwidth extension circuit 100. For example, a typical driver circuit including only the driver 102 may have a bandwidth that is limited by its drive resistance and load capacitance. However, this bandwidth may be increased using inductive peaking with a series peaking inductor (e.g., as illustrated in FIG. 1A with the active inductor 110) having a resonance frequency at or near a 3-dB bandwidth of the bandwidth extension circuit 100. In particular, inductive peaking is generated in the bandwidth extension circuit 100 by inducing the inverter 106 at a weaker, inverted, and delayed version of the signal at the driver 102 output. For fast-changing data, the inverter 106 has insufficient time to react, and the gain of the driver 102 may be large. Whereas, for slow changing data, the inverter 106 output contends with the driver 102 output, reducing its gain. The use of an active inductor (e.g., the active inductor 110 in FIG. 1A) for inductive peaking instead of a passive inductor may provide a compact solution that is compatible with digital circuitry fabrication processes (e.g., CMOS processes or the like) and is suitable for use on multiple bit lines.

Operation of the switch 106 in an open state may decouple the outputs of the inverter 106 and the driver 102. In this mode, referred to herein as a power-down mode, the driver 102 and the inverter 106 operate as two cascaded inverters with no feedback between the respective output nodes. As a result, the bandwidth extension circuit 100 does not provide active peaking in this power-down mode. However, it is contemplated herein that inductive peaking may not be necessary in this power down mode (e.g., when input signals applied to $V_{in}$ do not contain meaningful data) and that disrupting the feedback between the inverter 106 and the driver 102 may mitigate aging.

The bandwidth extension circuit 100 may be fabricated using any type of components known in the art. In some embodiments, the bandwidth extension circuit 100 is fabricated using MOS components. For example, the driver 102 and/or the active inductor 110 may include CMOS transistors (e.g., pairs of complementary p-type and n-type MOSFETs). As another example, the switch 106 and/or the resistor 104 may be fabricated as MOS elements. However, in a general sense, the components of the bandwidth extension circuit 100 may be fabricated using any transistor technology or fabrication process. For instance, components of the bandwidth extension circuit 100 may include, but are not limited to, FETs, MOSFETs, finFETs, BJTs, JFETs, IGBTs, HEMTs, TFETs, CNTFETs, or JLNTs.

Figure 1B:
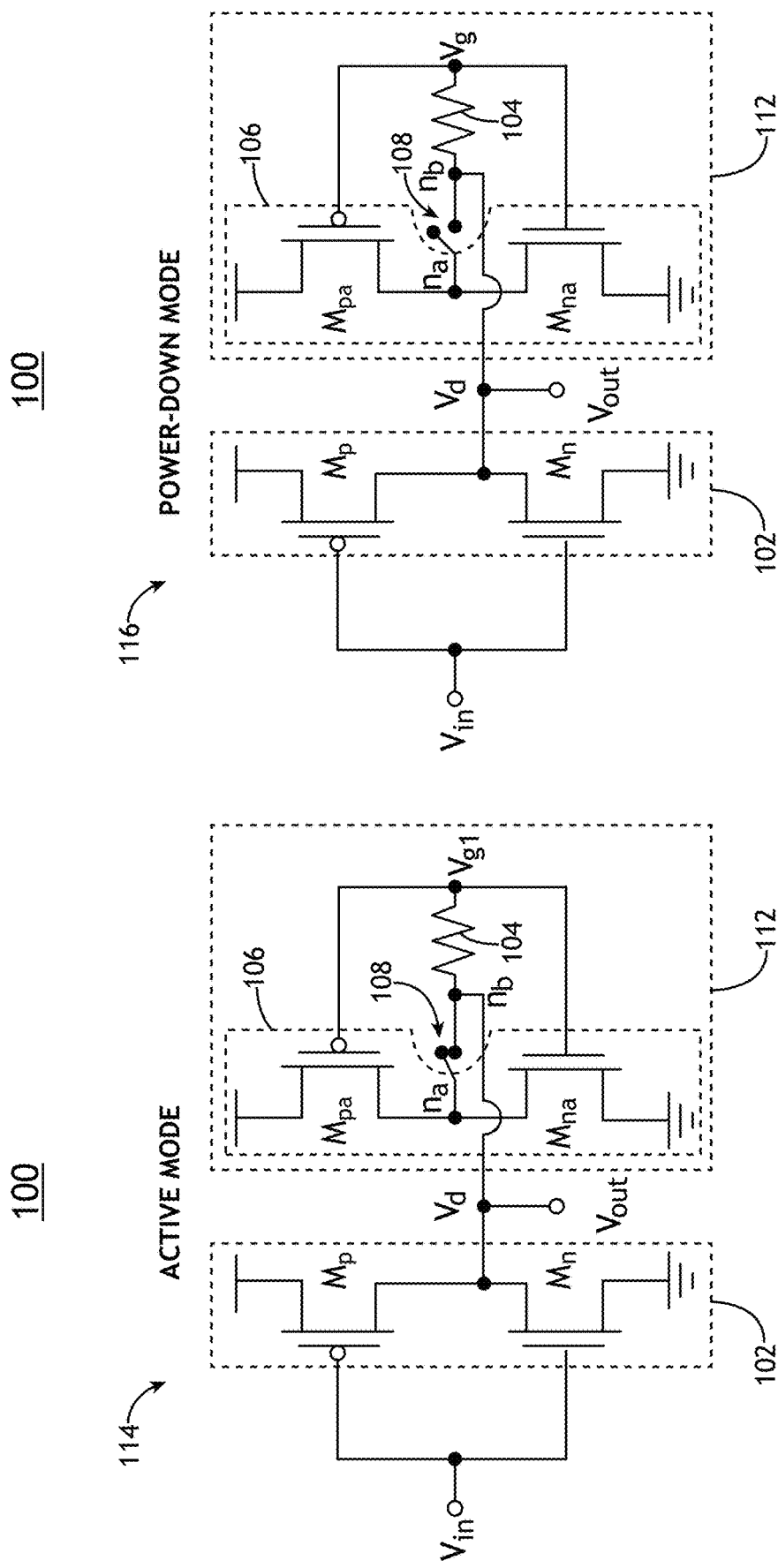
FIG. 1B illustrates the bandwidth extension circuit including complementary metal-oxide-semiconductor (CMOS) components, in accordance with one or more embodiments of the present disclosure.

FIG. 1B illustrates the bandwidth extension circuit 100 including CMOS components, in accordance with one or more embodiments of the present disclosure. In this configuration, the bandwidth extension circuit 100 may be a CMOS bandwidth extension circuit 100 or a CMOS driver. The panel 112 depicts a schematic of the bandwidth extension circuit 100 in the active operational mode with the switch 106 in a closed state. The panel 114 depicts a schematic of the bandwidth extension circuit 100 in the power-down operational mode with the switch 106 in an open state.

In FIG. 1B, the driver 102 is a CMOS inverter formed from a complementary pair of transistors (e.g., a PMOS transistor ($M_p$) and an NMOS transistor ($M_n$)). Similarly, the inverter 106 may also be a CMOS inverter formed from a complementary pair of transistors (e.g., a PMOS transistor ($M_{pa}$) and an NMOS transistor ($M_{na}$)). In this configuration, the gates of the transistors in the driver 102 are connected and provide an input node of the driver 102 and the bandwidth extension circuit 100 ($V_{in}$). An output node of the driver 102 as well as the bandwidth extension circuit 100 ($V_{out}$) is located between the drain of the constituent PMOS transistor and a drain of the NMOS transistor. Similarly, the gates of the transistors in the inverter 106 are connected and provide an input node of the inverter 106, while an output node of the inverter 106 is located between the drain of the constituent PMOS transistor and a drain of the constituent NMOS transistor.

Referring now to FIGS. 2A-4B, inductive peaking and aging performance of active inductors are described in greater detail, in accordance with one or more embodiments of the present disclosure. While FIGS. 2A-4B and the associated descriptions focus on a bandwidth extension circuit 100 implemented with CMOS components, FIGS. 2A-4B and the associated descriptions are provided solely for illustrative purposes and should not be interpreted as limiting. Rather, the systems and methods disclosed herein may be suitable for aging-averse operation of an active inductor in any suitable application.

Figure 2A:
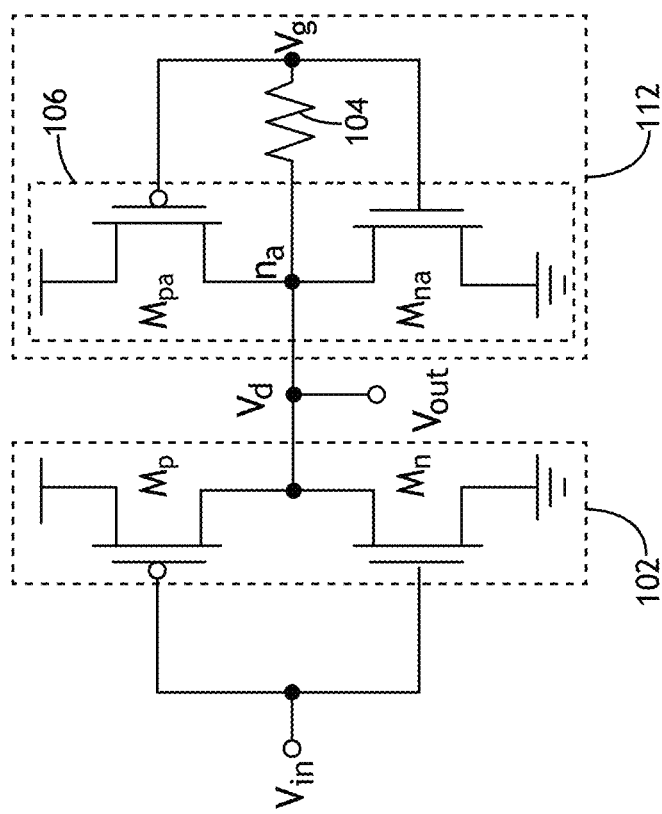
FIG. 2A is a schematic view of a CMOS bandwidth extension circuit including an active inductor and without the switch illustrated in FIGS. 1A and 1B, in accordance with one or more embodiments of the present disclosure.

FIG. 2A is a schematic view of a traditional CMOS bandwidth extension circuit 202 including an active inductor 110, in accordance with one or more embodiments of the present disclosure. The bandwidth extension circuit 202 is similar to the bandwidth extension circuit 100 in FIG. 1B except that the switch 106 is not present. In this circuit, an input voltage $V_{in}$ is inverted by the driver 102 to generate $V_d$. $V_g$ then corresponds to a delayed version of $V_d$ through the resistor 104 that is provided as an input to the inverter 106. The output node of the inverter 106 is then connected back to $V_d$ as a feedback loop. Thus, $V_d$ is also the output node of the bandwidth extension circuit 202 ($V_{out}$). Further, $V_g$ corresponds to gate voltages of the transistors $M_{pa}$ and $M_{na}$ of the inverter 106, while $V_d$ corresponds to drain voltages of the transistors $M_{pa}$ and $M_{na}$ of the inverter 106. Consideration of this bandwidth extension circuit 202 may be useful for understanding the operation of the CMOS bandwidth extension circuit 100 in FIG. 1B generally and may further provide a baseline for evaluating the performance and aging characteristics of the bandwidth extension circuit 100 in FIG. 1B. In this way, the impact of the switch 106 and various associated benefits of the bandwidth extension circuit 100 in FIG. 1B may be better understood.

Figure 2B:
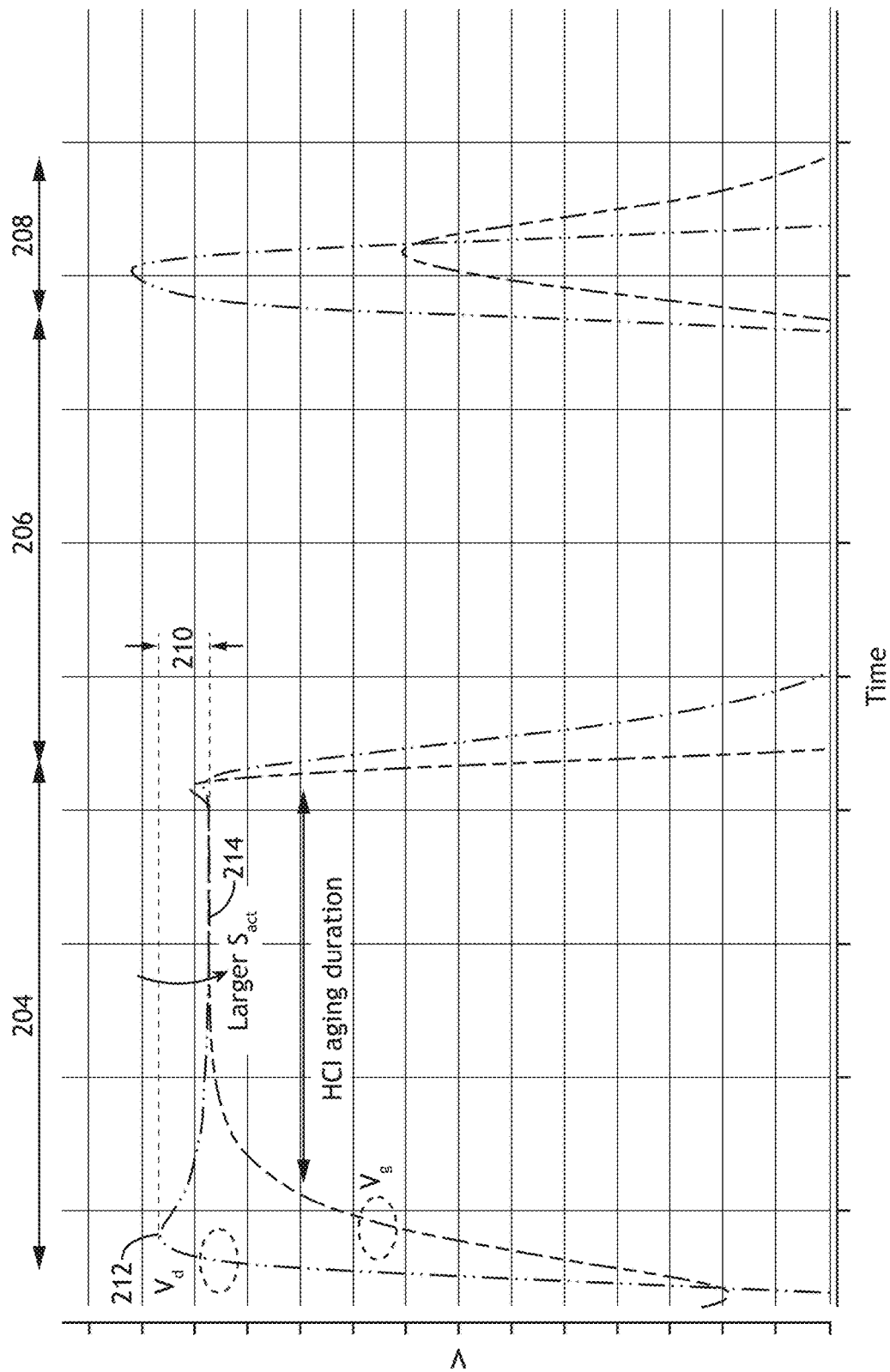
FIG. 2B is a plot of voltage at various nodes of the bandwidth extension circuit in FIG. 2A in response to an input signal, in accordance with one or more embodiments of the present disclosure.

FIG. 2B is a plot of voltage at various nodes of the bandwidth extension circuit 202 in FIG. 2A in response to an input signal, in accordance with one or more embodiments of the present disclosure. In particular, FIG. 2B illustrates voltages $V_d$ and $V_g$ during various transitions. In particular, FIG. 2B illustrates a pattern of bits (i.e., bit pattern) in which $V_d$ is high for several repeating bits (range 204), low for several repeating bits (range 206), and then high for a single bit (range 208). FIG. 2B further illustrates an inductive peaking voltage 210 of $V_d$ (e.g., a difference between a peak voltage value 212 and an equilibrium voltage value 214) when both $V_d$ and $V_g$ are driven high (e.g., in the case of repeating bits).

The feedback loop of the active inductor 110 generates a weaker, inverted, and delayed version of the data at the output of the driver 102 that is connected back to the output node of the driver 102 ($V_d$). This is illustrated in FIG. 2B as a temporal delay between $V_g$ and $V_d$ during both low-to-high and high-to-low transitions. The values of $V_g$ and $V_d$ then reach an equilibrium after a settling time that may be reached in cases of repeating bits.

As described previously herein, two significant sources of aging of MOSFET transistors include HCI and BTI. HCI may typically occur when a transistor experiences large current flow associated with simultaneously driving the drain voltage and the gate voltage high for an NMOS device (or low for a PMOS device). Under these HCI aging conditions, charges may become trapped in a gate of the transistor resulting in reduced carrier mobility and reduced current capacity. BTI may typically be induced when the gate voltage is driven high for an NMOS device (or low for a PMOS device) for an extended time, particularly at relatively high temperatures, and results in trapped charges and increased operational voltage thresholds. In many cases, the structural impact of BTI diminishes once BTI aging conditions are no longer present. In contrast, the structural impact of HCI typically does not diminish and slowly builds up upon increased exposure to HCI aging conditions.

It is contemplated herein that the bandwidth extension circuit 202 illustrated in FIG. 2A is susceptible to both HCI and BTI aging conditions.

For example, simultaneously driving $V_g$ and $V_d$ high for extended durations corresponds to HCI aging conditions in the inverter 106 that reduce an operational lifetime of the bandwidth extension circuit 202. In particular, simultaneously driving both $V_g$ and $V_d$ high corresponds to high gate and drain voltages for the transistors $M_{pa}$ and $M_{na}$ of the inverter 106. Exposure to these conditions induces HCI that increases the threshold voltages of these transistors as well as reduces the current flow. As illustrated in FIG. 2B, these HCI aging conditions are the most pronounced in the range 204 where $V_d$ is driven high for repeating bits (e.g., relatively low frequency data patterns [e.g., bit pattern]).

It is contemplated herein that the values and/or sizes of various components in the bandwidth extension circuit 202 may influence both the duration of HCI aging conditions and the inductive peaking performance. For example, relatively larger values of the resistor 104 and/or relatively larger values of a size ratio of the inverter 106 to the driver 102 ($S_{act}/S_{main}$) provide relatively higher inductive peaking as well as slower aging. In most cases, the inverter 106 is smaller than the driver 102 to provide feedback without overwhelming the driver 102. There may thus be a certain trade-off between the amount of peaking introduced by the active inductor 112 and how quickly it ages. In most cases, however, the amount of peaking required is predetermined by the communication channel conditions and may not be tweaked to improve other circuit aspects such as aging.

Further, increasing the size of the inverter 106 ($S_{act}$) increases the inductive peaking voltage 210 and also decreases the duration of the HCI aging conditions and the predicted aging impact. However, the size of the inverter 106 cannot be increased without limitation to fully mitigate aging. For example, the size ratio of the inverter 106 to the driver 102 may be selected to provide a desired amount of inductive peaking (e.g., a desired inductive peaking voltage 210) for a desired bandwidth improvement without degrading performance in other ways. As an illustration, inductive peaking results in a reduction of the equilibrium voltage value 214 relative to the peak voltage value 212 in cases of a high $V_d$ value for repeating bits (e.g., the range 204, but relatively little change when $V_d$ is driven high for a single bit (e.g., the range 208). Accordingly, too much inductive peaking may result in substantially lower $V_d$ levels for repeating high bits relative to single high bits, which may negatively impact noise and/or transmission performance metrics.

As a result, the presence of HCI aging conditions is a direct consequence of the use of an active inductor 110 design to provide inductive peaking. Further, aging may be most severe when no data is being input the bandwidth extension circuit 202 (e.g., a constant $V_{in}$) such that $V_d$ and $V_g$ are constant for extended periods of time, particularly if $V_d$ and $V_g$ are held at high levels for extended periods of time.

The bandwidth extension circuit 202 illustrated in FIG. 2A is further susceptible to BTI aging conditions in some scenarios. For example, the transistors within the driver 102 and/or the inverter 106 may be exposed to BTI aging conditions whenever $V_{in}$ is held constant since the gate voltage of either the driver 102 or the inverter 106 will be high regardless of the particular value of $V_{in}$. Since BTI aging is largely reversable, BTI aging in the bandwidth extension circuit 202 in FIG. 2A may be mitigated by frequently toggling the input signal $V_{in}$.

However, it is noted that the bandwidth extension circuit 202 is not conducive to simultaneous mitigation of both HCI and BTI.

It is contemplated herein that a bandwidth extension circuit (e.g., the bandwidth extension circuit 202, the bandwidth extension circuit 100, a driver circuit, or the like) may generally be operated in at least two conditions, referred to herein as a run-time condition and a down-time condition. In a run-time condition, a signal applied to an input node ($V_{in}$) may typically be modulated with data (e.g., a pattern of high and low bits, or other bit pattern) and a signal provided by the bandwidth extension circuit at an output node ($V_{out}$) may be provided to and utilized by an external device or system. In a down-time condition, the bandwidth extension circuit may be connected to power, but a signal applied to the input node ($V_{in}$) may typically not include meaningful data and the signal provided by the bandwidth extension circuit at an output node ($V_{out}$) may typically not be utilized by an external device or a system. In this down-time condition, the signal applied to the input node ($V_{in}$) may generally have any value including, but not limited to, a fixed value or a floating value. For example, in a communications system, the down-time condition may occur between data streams or when a device is in a stand-by mode.

As an illustration related to the bandwidth extension circuit 202, BTI aging may generally be mitigated by frequent toggling of the input signal $V_{in}$, which may naturally occur during run-time (or a run-time condition) when $V_{in}$ includes a signal modulated with data for transmission. Further, the input signal $V_{in}$ may be intentionally toggled when $V_{in}$ does not include a signal modulated with data for transmission, which is referred to herein as down-time or a down-time condition. However, the bandwidth extension circuit 202 suffers from HCI aging whenever $V_d$ and $V_g$ are simultaneously high for NMOS devices or simultaneously low for PMOS devices. As illustrated in FIG. 2B, this may occur at least briefly when $V_d$ is driven high or low for a single bit (e.g., range 208) or when $V_d$ is driven high or low for multiple repeating bits (e.g., range 204 and range 206). As a result, toggling the input signal $V_{in}$ during down-time when $V_{in}$ does not include a signal modulated with data (or at least meaningful data) for transmission may mitigate BTI but not HCl. Alternatively, forcing $V_{in}$ at a low or high value during down-time while forcing $V_g$ to the same value and disconnecting the feedback resistor 104 through external power down switches may mitigate HCl in the inverter 106 but the driver 102 may be subjected to BTI.

Referring now generally to FIGS. 1A, 1B, 2A, 2B, and 3A-4B, aging characteristics of the bandwidth extension circuit 100 including the switch 106 are described in greater detail, in accordance with one or more embodiments of the present disclosure. It is contemplated that a bandwidth extension circuit 100 as disclosed herein including the switch 106 may enable operation of the bandwidth extension circuit 100 in a manner that mitigates aging of the constituent components (e.g., the inverter 106). For example, the circuits, systems, and methods disclosed herein enable control over the frequency and/or duration that transistors within the bandwidth extension circuit 100 are operated under aging conditions such as, but not limited to, HCl or BTI aging conditions. As a result, the operational lifetime of the bandwidth extension circuit 100 as disclosed herein may be substantially longer than an operational lifetime of alternative bandwidth extension circuits such as, but not limited to, the design illustrated in FIG. 2A.

In particular, the switch 106 in the bandwidth extension circuit 100 illustrated in FIGS. 1A and 1B enables operation of the bandwidth extension circuit 100 in two modes: the active mode in which the switch 106 is in a closed state (see e.g., the left panel 112 in FIG. 1B) and a power-down mode in which the switch 106 is in an open state (see e.g., the right panel 114 in FIG. 1B). HCl and/or BTI may be mitigated in each of these modes.

For example, the power-down mode may be suitable for, but is not limited to, operation during down-time when the input signal $V_{in}$ does not include modulated data. In this configuration, as illustrated in the right panel 114 in FIG. 1B, the switch 106 in an open state disrupts the feedback across the inverter 106. In particular, the output of the inverter 106 is connected to a first node ($n_a$) of the switch 106 and $V_d$ (also $V_{out}$) is connected to a second node ($n_b$) of the switch 106. In this configuration, the driver 102 and the inverter 106 are simply two cascaded inverters such that $V_d$ and $V_g$ are never simultaneously high or low, which mitigates HCl aging for both NMOS and PMOS device types. Although the disruption of the feedback in this power-down mode does not provide inductive peaking, inductive peaking is not needed when the input signal $V_{in}$ does not include modulated data. Additionally, BTI may be mitigated by modulating the input signal $V_{in}$ artificially in the power-down mode. As a result, both HCl and BTI are mitigated in this power-down mode. It is noted that the input signal ($V_{in}$) may be modulated using any suitable pattern (e.g., bit pattern) including, but not limited to, alternating high and low bits, a random series of high and low bits, a pseudo-random series of high and low bits, or a preselected series of high and low bits.

As another example, the active mode may be suitable for, but is not limited to, operation during run-time when the input signal $V_{in}$ is modulated with data. In this case, the inherent modulation of the input signal ($V_{in}$) with data may largely mitigate BTI. Further, a voltage drop across the switch 106 in series with the transistors $M_{na}$ and $M_{pa}$ of the inverter 106 (e.g., between na and $V_d$) may reduce the drain voltage of the transistor $M_{na}$ when $V_d$ is driven high (or the drain of the transistor $M_{pa}$ when $V_d$ is driven low) and thus decrease the severity and/or duration of HCl aging conditions for this transistor. In this way, HCl may be partially mitigated relative to alternative designs such as, but not limited to, the design illustrated in FIG. 2A even during run-time conditions. Additionally, this voltage drop across the switch 106 (e.g., associated with a resistance of the switch 106) may not be considered parasitic since the switch 106 is in series with the resistor 104 and directly contributes to inductive peaking. Moreover, this switch may be implemented organically as a segment of the feedback resistor 104 by utilizing finger partitioning in case of a transistor implementation of this resistor.

Taken together, both the active and power-down operational modes may thus provide aging-averse operation of the bandwidth extension circuit 100 to prolong the operational lifetime of the bandwidth extension circuit 100.

Referring now to FIGS. 3A-4B, simulated aging performance of the bandwidth extension circuit 100 in FIG. 1B is compared to the bandwidth extension circuit 202 in FIG. 2A.

The conventional bandwidth extension circuit 202 in FIG. 2A exhibits the most severe aging in the down-time condition, whereas the aging averse bandwidth extension circuit 100 in FIG. 1B exhibits no (or negligible) detectable aging effects in this same condition. Further, although the aging averse bandwidth extension circuit 100 in FIG. 1B exhibits some detectable aging in the run-time mode, the effects are substantially reduced relative to the conventional bandwidth extension circuit 202 in FIG. 2A.

Figure 3A:
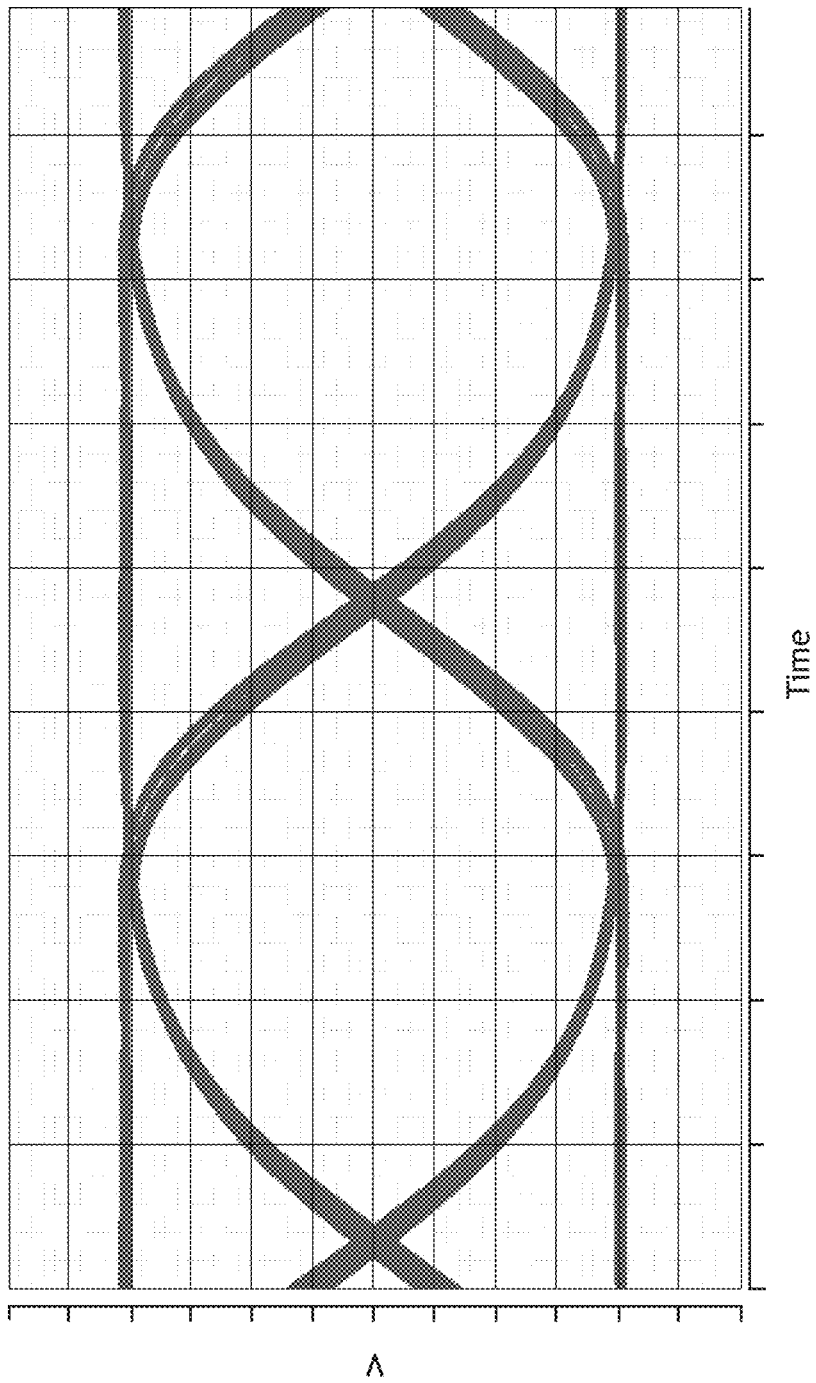
FIG. 3A is an eye diagram for the bandwidth extension circuit in FIG. 1B in a new state (e.g., prior to aging), in accordance with one or more embodiments of the present disclosure.
Figure 3B:
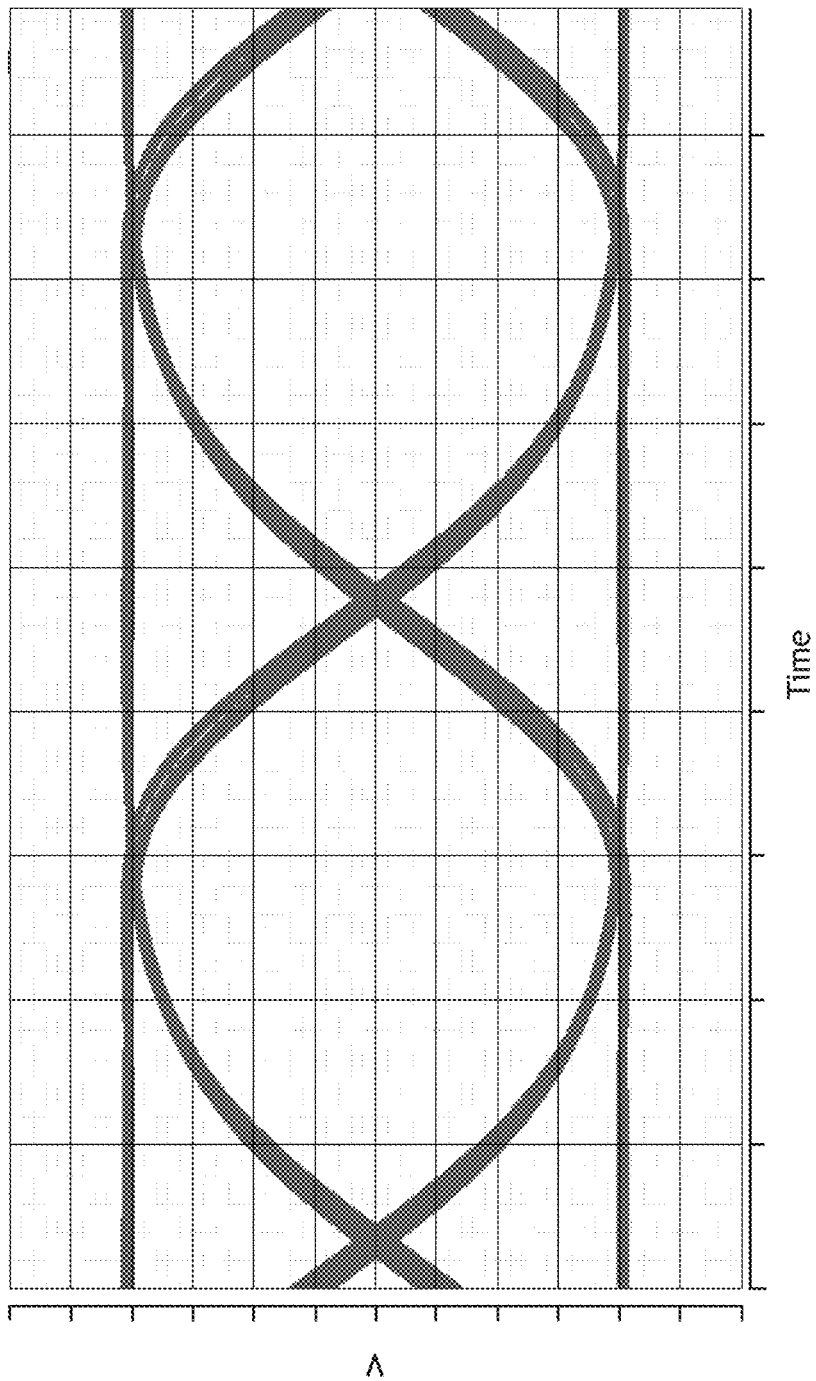
FIG. 3B is an eye diagram for the bandwidth extension circuit in FIG. 1B after aging for 10 years, in accordance with one or more embodiments of the present disclosure.
Figure 4A:
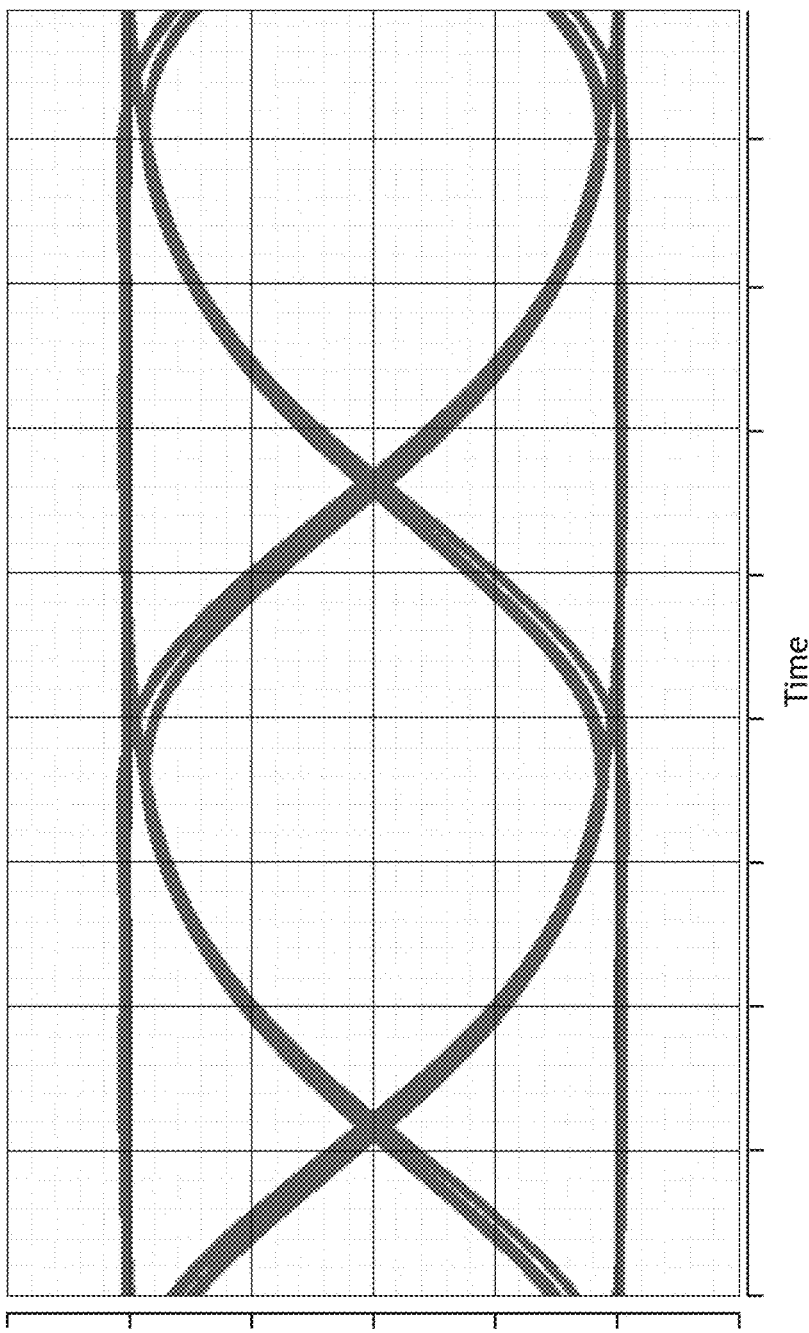
FIG. 4A is an eye diagram for the bandwidth extension circuit in FIG. 2A in a new state (e.g., prior to aging), in accordance with one or more embodiments of the present disclosure.
Figure 4B:
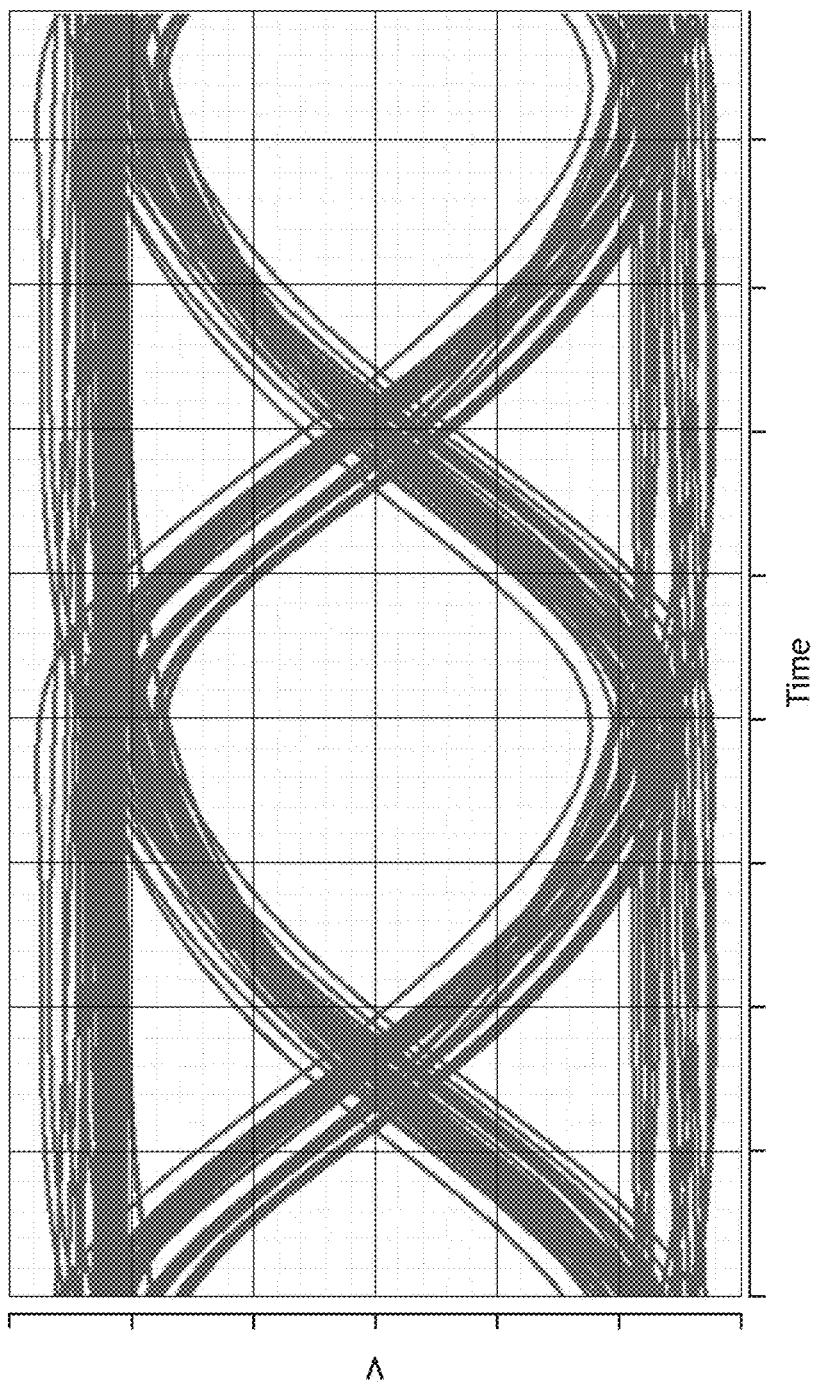
FIG. 4B is an eye diagram for the bandwidth extension circuit in FIG. 2A after aging for 10 years, in accordance with one or more embodiments of the present disclosure.

FIGS. 3A-4B depict simulated eye diagrams before and after aging for the bandwidth extension circuit 100 in FIG. 1B and the bandwidth extension circuit 202 in FIG. 2A. FIG. 3A is an eye diagram for the bandwidth extension circuit 100 in FIG. 1B in a new state (e.g., prior to aging), in accordance with one or more embodiments of the present disclosure. FIG. 3B is an eye diagram for the bandwidth extension circuit 100 in FIG. 1B after aging for 10 years, in accordance with one or more embodiments of the present disclosure. FIG. 4A is an eye diagram for the bandwidth extension circuit 202 in FIG. 2A in a new state (e.g., prior to aging), in accordance with one or more embodiments of the present disclosure. FIG. 4B is an eye diagram for the bandwidth extension circuit 202 in FIG. 2A after aging for 10 years, in accordance with one or more embodiments of the present disclosure.

As illustrated in FIGS. 3A and 3B, the eye diagram of the aging averse bandwidth extension circuit 100 in FIG. 1B exhibits only minor changes after the simulated 10 years of aging, which indicates that the operational characteristics and associated noise metrics are relatively unchanged. In contrast, as illustrated in FIGS. 4A and 4B, the eye diagram of the conventional bandwidth extension circuit 202 in FIG. 2A exhibits substantial degradation after the simulated 10 years of aging. For example, the eye diagram in FIG. 4B reveals a substantial decrease in the signal-to-noise ratio and a substantial increase in temporal variations.

Figure 5:
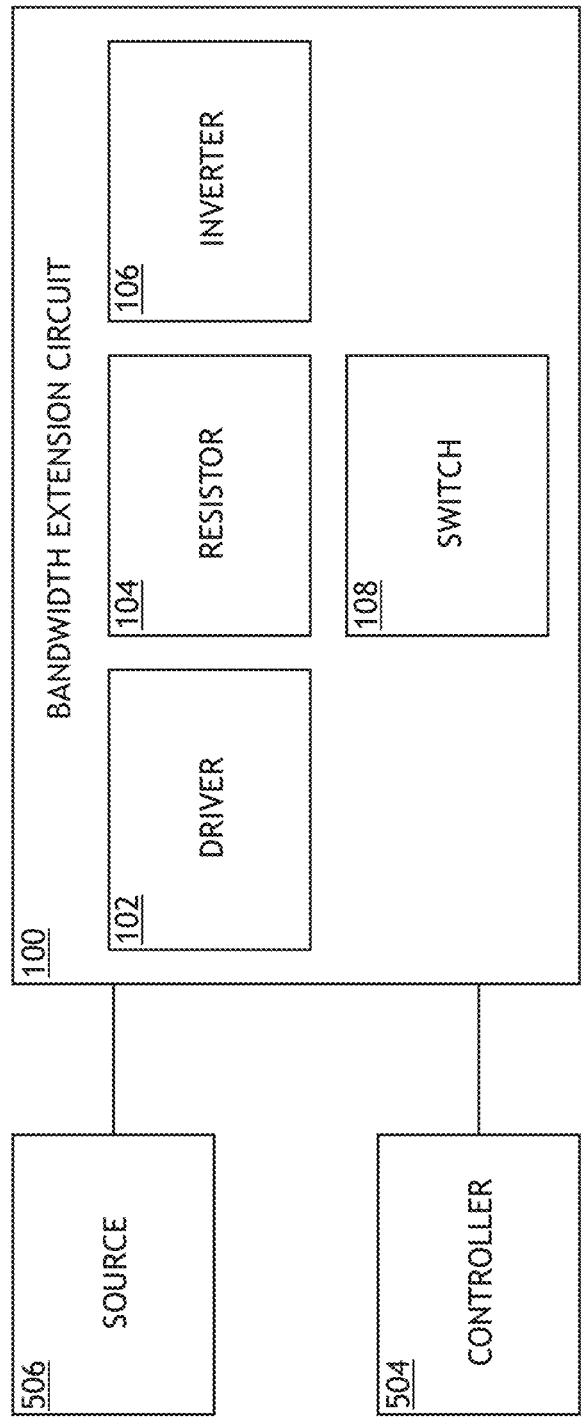
FIG. 5 is a block diagram of a system including a bandwidth extension circuit 100, in accordance with one or more embodiments of the present disclosure.

Referring now to FIG. 5, FIG. 5 is a block diagram of a system 502 including a bandwidth extension circuit 100, in accordance with one or more embodiments of the present disclosure. It is contemplated herein that a bandwidth extension circuit 100 may be implemented within any communications system including, but not limited to, a high-speed transceiver system (e.g., a wireline transceiver system). For example, a bandwidth extension circuit 100 may be implemented within systems such as, but not limited to, a SERDES system (e.g., a backplane SERDES system), a physical layer transceiver (PHY) (e.g., an ethernet PHY, or the like), an optical communications module (e.g., a pluggable optical communications module), or a coherent communications circuit. In this way, the system 502 may be generally suitable for a wide variety of applications and services such as, but not limited to, network switches, data center interconnects, coherent telecommunications solutions, high-speed PHY devices, or wireless base stations.

In some embodiments, a system 502 includes one or more bandwidth extension circuits 100 and a controller 504 to control the operational states of the bandwidth extension circuits 100. For example, the controller 504 may be communicatively coupled with the bandwidth extension circuits 100 to control (e.g., via drive signals) whether the bandwidth extension circuits 100 are in the active mode or in the power-down mode. In some embodiments, the controller 504 provides individual control of each of the bandwidth extension circuits 100. In this way, some bandwidth extension circuits 100 may be in an active mode while others may be in a power-down mode. In some embodiments, the controller 504 controls all of the bandwidth extension circuits 100 together such that each of the bandwidth extension circuits 100 operate in the same mode.

The bandwidth extension circuits 100 may be arranged in any suitable configuration. In some embodiments, two or more bandwidth extension circuits 100 are arranged along a transmission path to promote data integrity along the transmission path for a desired transmission distance. In some embodiments, two or more bandwidth extension circuits 100 are arranged along different transmission paths corresponding to different communication channels. In this way, the system 502 may provide or facilitate multi-channel communications. It is to be understood that these examples are illustrative only and are not limiting on the present disclosure.

As an illustration for the non-limiting depiction of a bandwidth extension circuit 100 in FIG. 1B, the controller 504 may be connected to the switches 106 of the bandwidth extension circuits 100. In this way, the controller 504 may direct a particular bandwidth extension circuit 100 to operate in the active mode (e.g., as depicted in the left panel 112 of FIG. 1B) by directing the constituent switch 106 to be in the closed state and/or to operate in the power-down mode (e.g., as depicted in the right panel 114 of FIG. 1B) by directing the constituent switch 106 to be in the closed state.

The controller 504 may have any architecture suitable for selectively modifying the states of the bandwidth extension circuits 100 or the constituent switches 106. In some embodiments, the controller 504 includes one or more processors configured to execute program instructions. Further, the program instructions may be stored on a memory device such as, but not limited to, read-only memory (ROM), random-access memory (RAM), or a solid-state drive. For example, the controller 504 may include any type of processing or logic circuitry such as, but not limited to, a microprocessor, an application specific integrated circuit (ASIC), a field programmable gate array (FPGA), or a digital signal processor (DSP).

In some embodiments, the system 502 further includes a source 506 to provide one or more signals (e.g., input signals $V_{in}$) to the bandwidth extension circuits 100. The source 506 may provide the same signals to each bandwidth extension circuit 100 or different signals to different bandwidth extension circuits 100. In some embodiments, one or more signals are received from an external system or device. For example, a signal including modulated data may be received from any location including the source 506 or an external system.

In some embodiments, the controller 504 directs a bandwidth extension circuit 100 to operate in the active mode (e.g., as depicted in the left panel 112 of FIG. 1B) when a signal directed to that bandwidth extension circuit 100 includes data. As described previously herein, such a scenario may be referred to as a run-time condition. For example, such a signal may include high and low bits (e.g., high and low voltage values) associated with data encoded using any technique known in the art. This signal may then be transmitted to an external device or system.

In some embodiments, the controller 504 directs a bandwidth extension circuit 100 to operate in the power-down mode (e.g., as depicted in the right panel 114 of FIG. 1B) when a signal directed to that bandwidth extension circuit 100 does not include data. As described previously herein, such a scenario may be referred to as a down-time condition. In this condition, power may be supplied to the bandwidth extension circuits 100 (e.g., through one or more power sources not explicitly illustrated), but the signal provided to the bandwidth extension circuit 100 may not have any meaningful data for transmission. Accordingly, operation in the power-down mode may mitigate HCl as described previously herein.

In some embodiments, the source 506 provides an arbitrary signal to the bandwidth extension circuit 100 in the power-down mode, where the arbitrary signal includes multiple transitions between high and low values to mitigate BTI in the bandwidth extension circuit 100 as described previously herein. This arbitrary signal may have any pattern of high and low bits (e.g., high and low voltages) including, but not limited to, an alternating pattern of high and low bits at any frequency and/or duty cycle, a random series of high and low bits, a pseudo-random series of high and low bits, or a pre-defined series of high and low bits.

Figure 6:
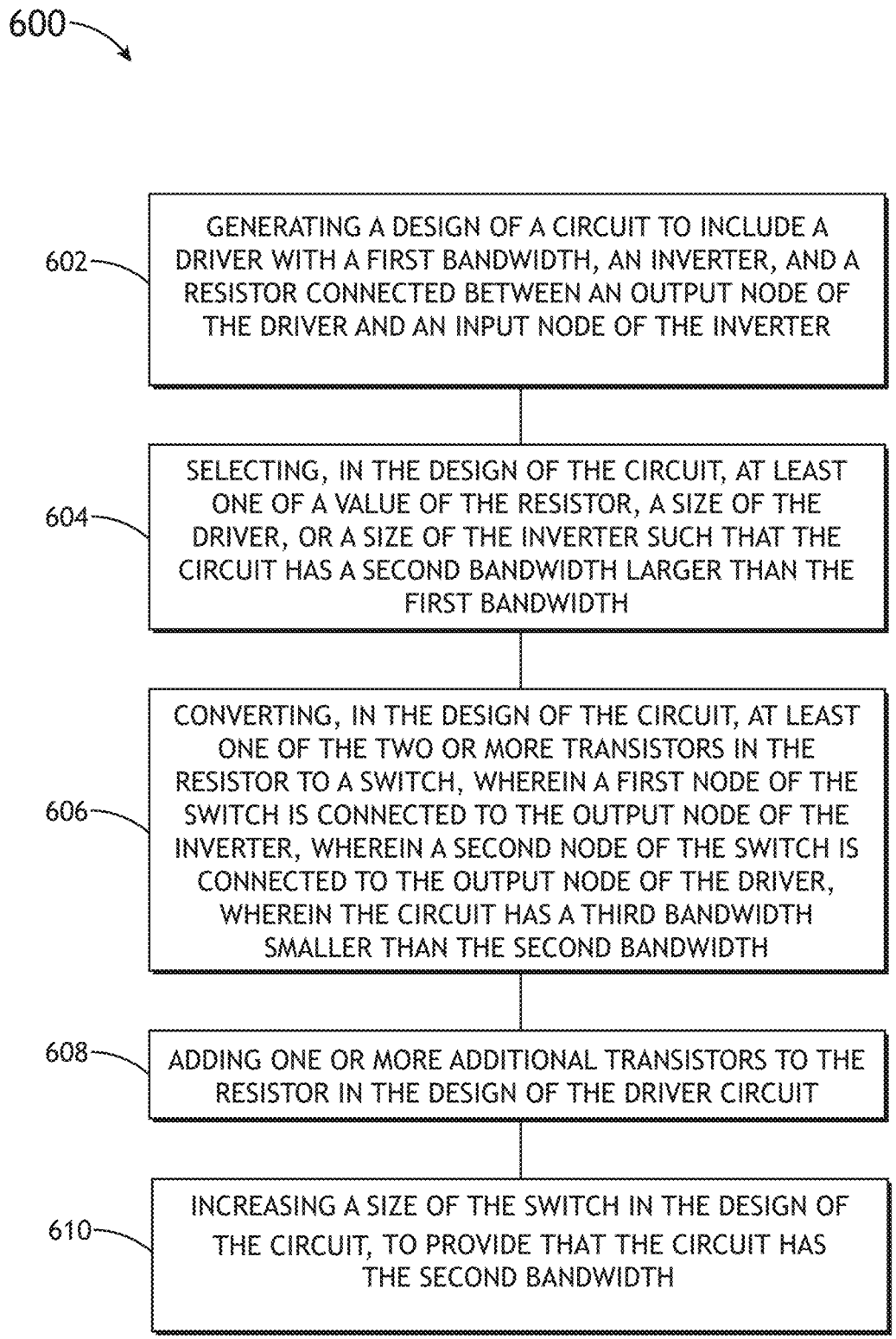
FIG. 6 is a flow diagram illustrating steps performed in a method for designing a bandwidth extension circuit, in accordance with one or more embodiments of the present disclosure.

FIG. 6 is a flow diagram illustrating steps performed in a method 600 for designing a circuit (e.g., a bandwidth extension circuit), in accordance with one or more embodiments of the present disclosure. Applicant notes that the embodiments and enabling technologies described previously herein in the context of the bandwidth extension circuit 100 should be interpreted to extend to the method 600. It is further noted, however, that the method 600 is not limited to the architecture of the bandwidth extension circuit 100.

It is to be understood that the method 600 is not limited to the particular steps depicted in FIG. 6. In some embodiments, the method 600 includes additional steps, which may be performed before the depicted steps, after the depicted steps, and/or between any of the depicted steps. In some embodiments, not all of the steps depicted in FIG. 6 are performed.

In some embodiments, the method 600 includes a step 602 of generating a design of a circuit (e.g., a bandwidth extension circuit, a driver circuit, a device, or the like) to include a driver 102 with a first bandwidth, an inverter 106, and a resistor 104 connected between an output node of the driver 102 and an input node of the inverter 106. In this configuration, an input node of the driver 102 may correspond to an input node of the circuit, while the output node of the driver may correspond to an output node of the circuit. Bandwidth may be the maximum rate of transfer for an electronic signal (e.g., data or current). In this way, a larger (e.g., expanded) bandwidth (e.g., provided by bandwidth expansion) may refer to a larger maximum rate of transfer for an electronic signal.

The resistor 104 may have any design suitable with a selected fabrication process. In some embodiments, the resistor 104 includes two or more transistors (e.g., MOSFET transistors or any other suitable transistors) with a common gate electrode. For example, the resistor 104 may include a multi-finger gate electrode distributed over one or more doped semiconductor regions.

Figure 7A:
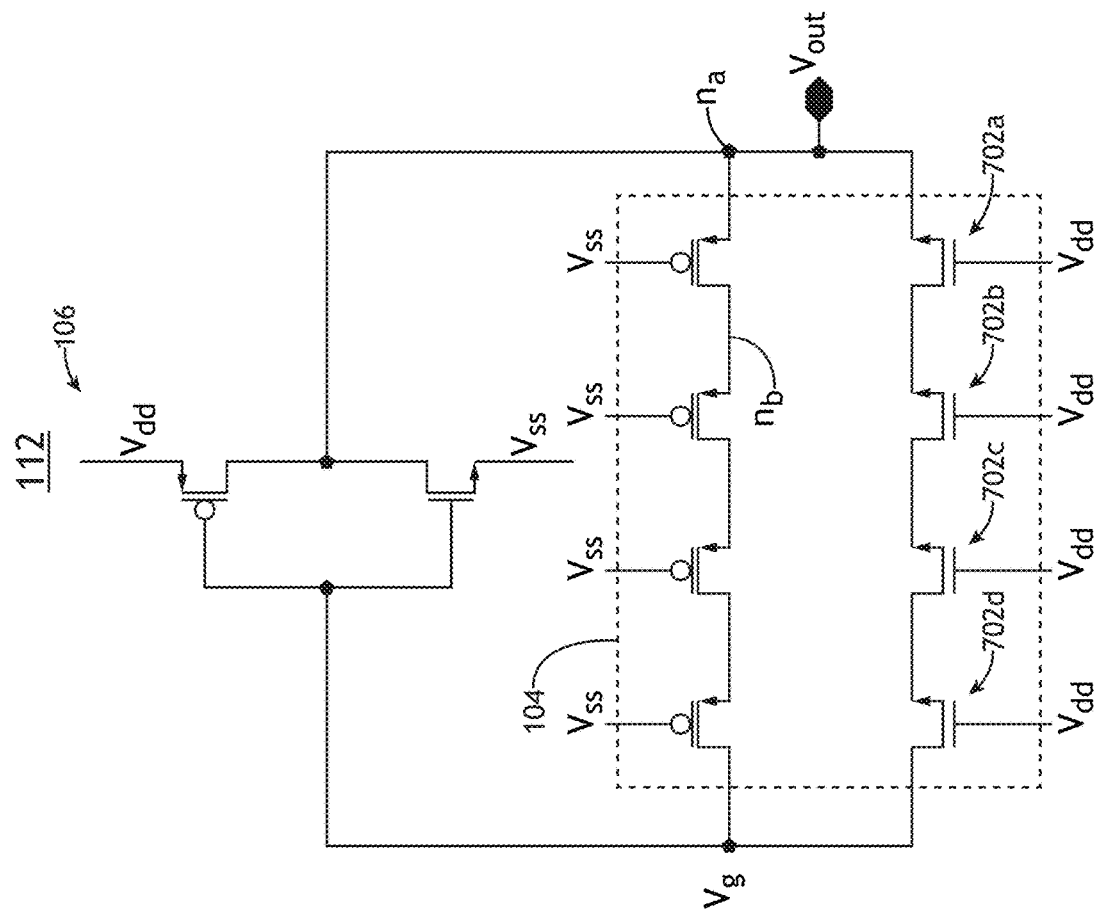
FIG. 7A is a simplified schematic of an active inductor formed as an inverter and a resistor as depicted in the bandwidth extension circuit 202 of FIG. 2A, in accordance with one or more embodiments of the present disclosure.

As an illustration, the circuit associated with step 602 may correspond to the bandwidth extension circuit 202 depicted in FIG. 2A. FIG. 7A is a simplified schematic of an active inductor 110 formed as an inverter 106 and a resistor 104 as depicted in the bandwidth extension circuit 202 of FIG. 2A, in accordance with one or more embodiments of the present disclosure. For example, FIG. 7A illustrates a configuration of the resistor 104 with four transistor pairs 702a-d, each formed as MOSFET transistors arranged to provide current flow with a specified resistance (e.g., the level of opposition to the flow of an electrical current). As an illustration, the four transistor pairs 702a-d may be formed with a common gate electrode having multiple series fingers (e.g., as a multi-finger device).

In some embodiments, the method 600 includes a step 604 of selecting, in the design of the circuit, at least one of a value of the resistor 104, a size of the driver 102, or a size of the inverter 106 such that the circuit has a second bandwidth larger than the first bandwidth.

Figure 7B:
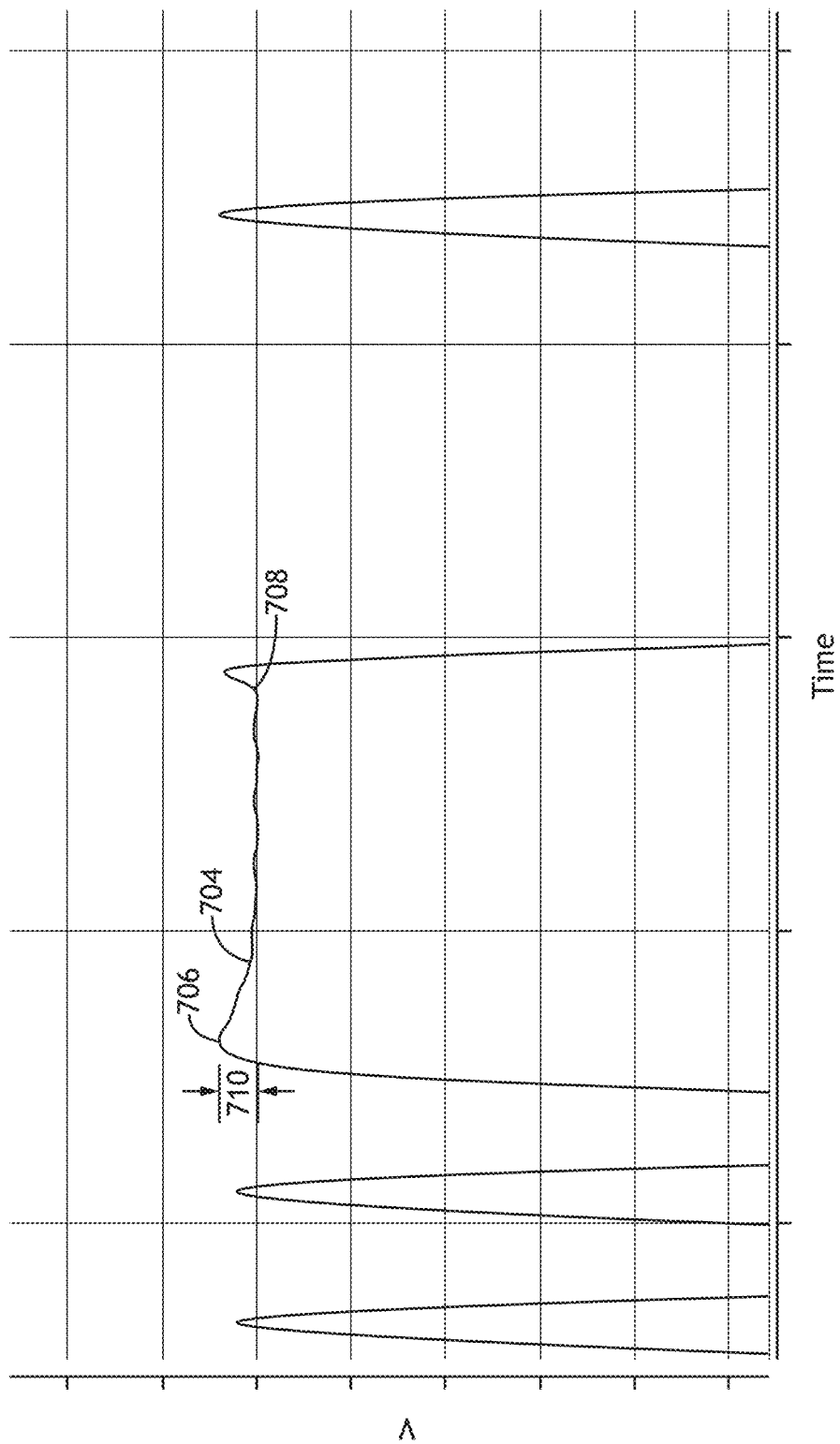
FIG. 7B is a graph including a plot of voltage at an output node of a bandwidth extension circuit for a series of bits, in accordance with one or more embodiments of the present disclosure.

FIG. 7B is a graph including a plot 704 of voltage at an output node of a bandwidth extension circuit for a series of bits, in accordance with one or more embodiments of the present disclosure. In particular, FIG. 7B corresponds to a high bit, a low bit, a high bit, a low bit, a repeating series of high bits, a repeating series of low bits, and a high bit.

Inductive peaking is evident in the plot of FIG. 7B, particularly in the series of repeating high bits. For example, the transition to the series of high bits exhibits a peak voltage value 706 that decays to an equilibrium voltage value 708.

It is contemplated herein that inductive peaking may be characterized in step 602 by any suitable metric such as, but not limited to, an inductive peaking voltage 710 associated with a difference between the peak voltage value 706 and the equilibrium voltage value 708.

In some embodiments, the method 600 includes a step 606 of converting, in the design of the circuit, at least one of the two or more transistors in the resistor 104 to a switch 106, where a first node of the switch 106 is connected to the output node of the inverter 106, where a second node of the switch 106 is connected to the output node of the driver 102, and where the circuit has a third bandwidth smaller than the second bandwidth. For example, converting at least one of the two or more transistors in the resistor 104 into a switch 106 may be carried out by separating the gate electrodes of the transistors forming the switch 106 from the other transistors forming the resistor 104 and moving an output node ($V_{out}$) of the active inductor 110 from node $n_a$ to node $n_b$ providing a connection to the output node of the driver 102 (e.g., $V_d$ in FIG. 1B). As an illustration in the case where the resistor 104 is formed as a multi-finger device, the step 606 may be carried out by moving the output node ($V_{out}$) providing the connection to the output node of the driver 102 ($V_d$) by one finger to the left.

Figure 8A:
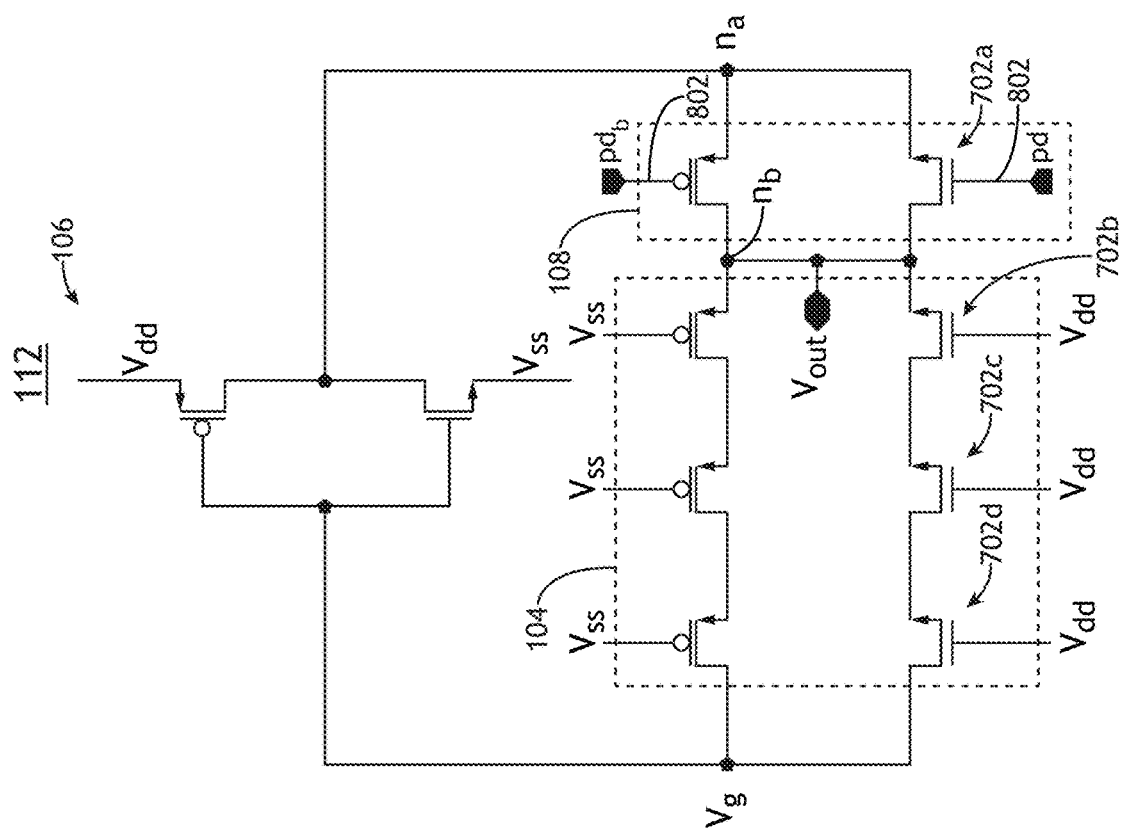
FIG. 8A is a simplified schematic of the active inductor in FIG. 7A in which one transistor pair of the resistor is converted to a switch, in accordance with one or more embodiments of the present disclosure.

FIG. 8A is a simplified schematic of the active inductor 110 in FIG. 7A in which one transistor pair 702a of the resistor 104 is converted to a switch 106, in accordance with one or more embodiments of the present disclosure. For example, FIG. 8A illustrates conversion of transistor pair 702a to a switch 106 by moving the output node ($V_{out}$) by one finger to the left for connection to the output of the driver 102 ($V_d$) as well modifying the gate nodes 802 (depicted as pd and $pd_b$) to provide control of a state of the switch 106 (e.g., via the controller 504 as depicted in FIG. 5). In this way, the switch 106 may operate an open state or a closed state based on control signals provided to the gate nodes 802.

Figure 8B:
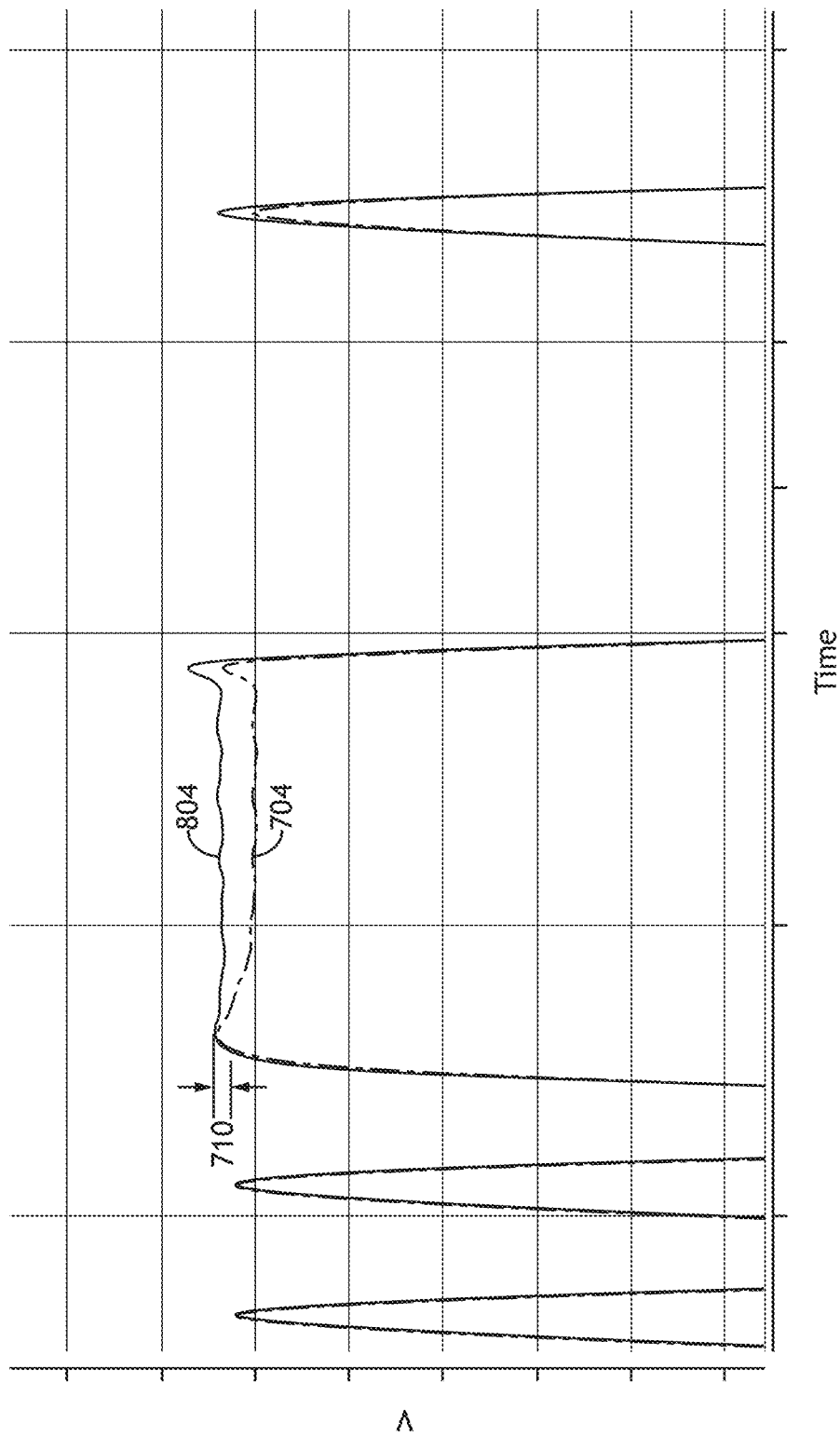
FIG. 8B is a graph including FIG. 7B plus an additional plot of a voltage at the output node of the bandwidth extension circuit based on the design of the active inductor in FIG. 8A, in accordance with one or more embodiments of the present disclosure.

FIG. 8B is a graph including FIG. 7B plus an additional plot 804 illustrating a voltage at the output node (e.g., $V_{out}$ in FIG. 1B) of the bandwidth extension circuit based on the design of the active inductor 110 in FIG. 8A, in accordance with one or more embodiments of the present disclosure. As illustrated in FIG. 8B, converting at least one of the transistors of the resistor 104 to a switch 106 may decrease the inductive peaking voltage 210.

In some embodiments, the method 600 includes a step 608 of adding one or more additional transistors to the resistor 104 in the design of the circuit. For example, one or more additional transistors may be added between the output node ($V_{out}$) for connection to the output of the driver 102 ($V_d$) and the input node of the inverter 106 ($V_g$). This may provide recovery of some of the lost peaking from step 606. As an illustration in the case where the resistor 104 is formed as a multi-finger device, the step 606 may be carried out by adding one or more additional fingers in series to the resistor 104 between nodes $n_b$ and $V_g$.

Figure 9:
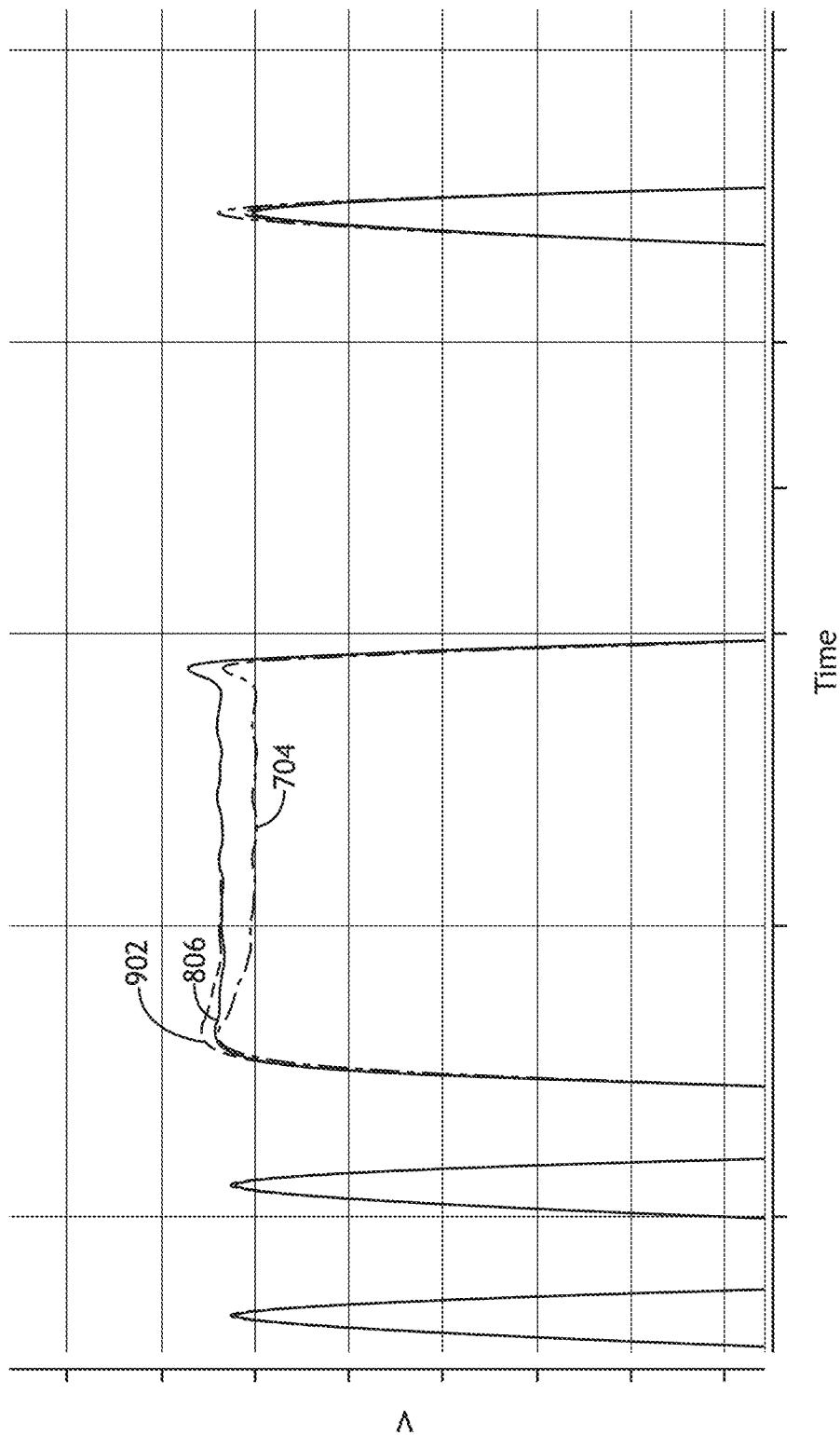
FIG. 9 is a graph including FIG. 8B plus an additional plot of a voltage at the output node of a bandwidth extension circuit based on the design of the active inductor in FIG. 8A, in accordance with one or more embodiments of the present disclosure.

FIG. 9 is a graph including FIG. 8B plus an additional plot 902 illustrating a voltage at the output node (e.g., $V_{out}$ in FIG. 1B) of a bandwidth extension circuit based on the design of the active inductor 110 in FIG. 9, in accordance with one or more embodiments of the present disclosure. As illustrated in FIG. 9, a portion of the inductive peaking voltage 710 is recovered by the addition of the transistor pair 702e.

Figure 10:
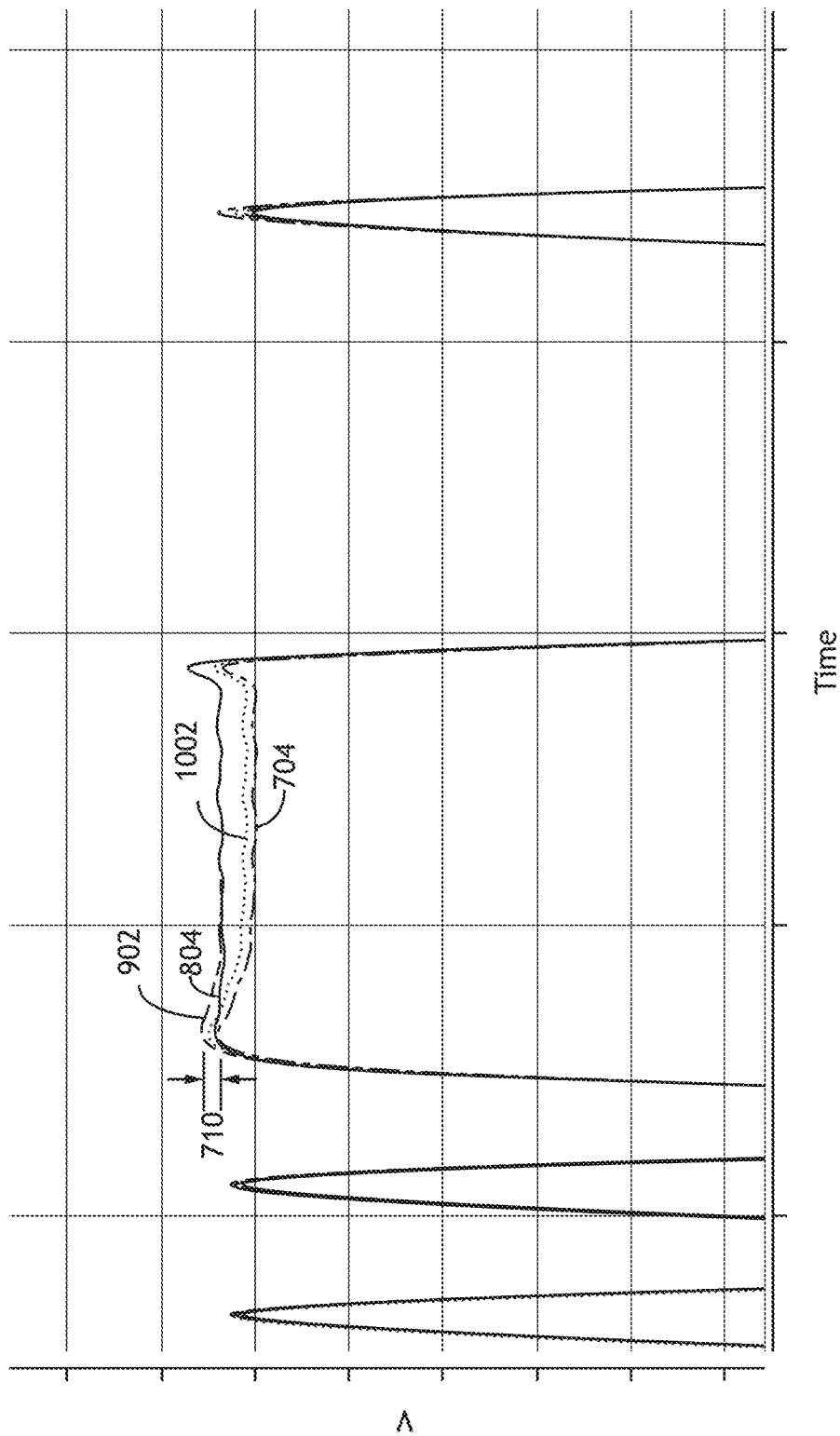
FIG. 10 is a graph including FIG. 9 plus an additional plot of a voltage at the output node of a bandwidth extension circuit based on the design of the active inductor in FIG. 8A after increasing a size of the switch, in accordance with one or more embodiments of the present disclosure.

In some embodiments, the method 600 includes a step 610 of increasing a size of the switch 106 in the design of the circuit to provide that the circuit has the second bandwidth. The size of the switch 106 may be increased by any amount suitable for recovering additional inductive peaking. In some embodiments, the step 610 includes doubling a size of the switch 106. In some embodiments, the step 610 includes increasing a number of fins of one or more transistors in the switch 106. For example, the switch 106 may include one or more finFET transistors in which doped semiconductor regions are formed as one or more fins that are at least partially surrounded by a gate electrode. A finFET transistor width is dependent on its number of fins and is typically expressed in an n×m format where n represents the number of fingers and m represents the number of fins per finger. As an illustration, if the transistor pairs 702a-e (e.g., associated with steps 602-608) are formed as 1×3 fin devices, the step 610 may include converting the transistor pair 702a associated with the switch 106 to a 2×3 fin device. In this configuration, the inverter 106 may be of any suitable size including, but not limited to, a 2×3 fin device. FIG. is a graph including FIG. 9 plus an additional plot 1002 illustrating a voltage at the output node of a bandwidth extension circuit based on the design of the active inductor 110 after increasing a size of the switch 106, in accordance with one or more embodiments of the present disclosure. As illustrated in FIG. 10, the inductive peaking (e.g., as measured by the inductive peaking voltage 710) is restored. As a result, the designed circuit (e.g., the bandwidth extension circuit 100 illustrated in FIG. 1B) including the switch 106 may have the same or substantially the same inductive peaking performance as a traditional bandwidth extension circuit 202 without the switch 106 while providing an aging-averse operation and a correspondingly longer operational lifetime without incurring any considerable bandwidth penalty.

In some embodiments, though not explicitly shown, the method 600 includes a step of fabricating the circuit based on the design of the circuit. The circuit and the constituent components may be fabricated using any technology or fabrication processes known in the art. In this way, constituent transistors may include, but are not limited to CMOS transistors, FET transistors, or BJT transistors.

It should be noted that none of the figures described herein (e.g., FIGS. 7B, 8B, 9, and 10) directly illustrate bandwidth values. The figures instead illustrate inductive peaking, which may impact bandwidth and be used as a bandwidth extension technique.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A circuit comprising:
   a driver;
   an inverter;
   a resistor between an output node of the driver and an input node of the inverter, wherein a first node of the resistor is connected to the output node of the driver and a second node of the resistor is connected to the input node of the inverter; and
   a switch between an output node of the inverter and the first node of the resistor, wherein an input node of the driver corresponds to an input node of the circuit, wherein the output node of the driver corresponds to an output node of the circuit;
   wherein a closed state of switch enables a feedback cross the inverter, the inverter and the resistor operating as an active inductor in the closed state, the active inductor being configured to provide a high-frequency gain associated with an inductive peaking of the active inductor.

2. The circuit of claim 1, wherein operation of the switch in a closed state couples the output node of the inverter to the output node of the driver.

3. The circuit of claim 2, wherein operation of the switch in the closed state provides bandwidth extension for a signal provided to the input node of the circuit.

4. The circuit of claim 3, wherein at least one of a size of one or more transistors in the driver, a size of one or more transistors in the inverter, or a resistance of the resistor are selected to provide the bandwidth extension.

5. The circuit of claim 1, wherein operation of the switch in an open state decouples the output node of the inverter from the output node of the driver.

6. The circuit of claim 1, wherein the resistor is formed as one or more transistors, wherein the switch is formed as one or more additional transistors in series with the resistor.

7. The circuit of claim 1, wherein at least one of the driver, the inverter, the resistor, or the switch include at least one of a field-effect transistor (FET), a metal-oxide-semiconductor FET (MOSFET) transistor, a finFET transistor, a bipolar junction transistor (BJT), a junction field-effect transistor (JFET), an insulated-gated bipolar transistor (IGBT), a high-electron-mobility transistor (HEMT), a tunnel field-effect transistor (TFETs), a carbon nanotube FET (CNTFET), or a junction-less nanowire transistor (JLNT).

8. A system comprising:
   one or more circuits, each comprising:
      a driver;
      an inverter;
      a resistor connected between an output node of the driver and an input node of the inverter, wherein a first node of the resistor is connected to the output node of the driver and a second node of the resistor is connected to the input node of the inverter; and
      a switch between an output node of the inverter and the first node of the resistor, wherein an input node of the driver corresponds to an input node of the circuit, wherein the output node of the driver corresponds to an output node of the circuit; and
   a controller coupled to the one or more circuits, wherein the controller causes the switch in each of the one or more circuits to operate in one of an open state or a closed state;
   wherein a closed state of switch enables a feedback cross the inverter, the inverter and the resistor operating as an active inductor in the closed state, the active inductor being configured to provide a high-frequency gain associated with an inductive peaking of the active inductor.

9. The system of claim 8, wherein the controller causes the switch of a particular one of the one or more circuits to operate in the closed state when a signal applied to the input node of the particular one of the one or more circuits is modulated by data, wherein the controller directs the switch of the particular one of the one or more circuits to operate in the open state otherwise.

10. The system of claim 9, wherein operation of the switch of the particular one of the one or more circuits in the closed state couples the output node of the inverter to the output node of the driver.

11. The system of claim 9, wherein operation of the switch of the particular one of the one or more circuits in the closed state provides bandwidth extension for the signal applied to the input node of the particular one of the one or more circuits.

12. The system of claim 9, wherein operation of the switch in the open state decouples the output node of the inverter from the output node of the driver.

13. The system of claim 9, further comprising:
   a source communicatively coupled to the controller, wherein the controller directs the source to provide a signal having a selected bit pattern to the particular one of the one or more circuits when the switch of the particular one of the one or more circuits is in the open state.

14. The system of claim 13, wherein the selected bit pattern comprises:
   at least one of alternating high and low bits, a random series of high and low bits, or a pseudo-random series of high and low bits.

15. The system of claim 9, wherein at least one of the driver, the inverter, the resistor, or the switch of the particular one of the one or more circuits include at least one of a field-effect transistor (FET), a metal-oxide-semiconductor FET (MOSFET) transistor, a finFET transistor, a bipolar junction transistor (BJT), or a junction field-effect transistor (JFET), an insulated-gated bipolar transistor (IGBT), a high-electron-mobility transistor (HEMT), a tunnel field-effect transistor (TFETs), a carbon nanotube FET (CNTFET), or a junction-less nanowire transistor (JLNT).

16. The system of claim 9, wherein the resistor is formed as one or more transistors, wherein the switch is formed as one or more additional transistors in series with the resistor.

17. A circuit comprising:
   a driver;
   an inverter;
   a resistor between an output node of the driver and an input node of the inverter, wherein a first node of the resistor is connected to the output node of the driver and a second node of the resistor is connected to the input node of the inverter; and
   a switch between an output node of the inverter and the first node of the resistor, wherein an input node of the driver corresponds to an input node of the circuit, wherein the output node of the driver corresponds to an output node of the circuit;
   wherein a closed state of switch enables a feedback cross the inverter, the inverter and the resistor operating as an active inductor in the closed state, the active inductor being configured to provide a high-frequency gain associated with an inductive peaking of the active inductor;
   wherein an open state of the switch decouples the output of the inverter and the driver, the inverter and the driver operate as cascaded inverters with no feedback in the open state.

* * * * *